(12) United States Patent
Mitsuyama

(10) Patent No.: US 12,002,909 B2
(45) Date of Patent: Jun. 4, 2024

(54) SURFACE-MOUNTED MULTI-COLORED LIGHT EMITTING DEVICE

(71) Applicant: NICHIA CORPORATION, Anan (JP)

(72) Inventor: Kenta Mitsuyama, Anan (JP)

(73) Assignee: NICHIA CORPORATION, Anan (JP)

( * ) Notice: Subject to any disclaimer, the term of this patent is extended or adjusted under 35 U.S.C. 154(b) by 194 days.

(21) Appl. No.: 17/410,213

(22) Filed: Aug. 24, 2021

(65) Prior Publication Data
US 2022/0069181 A1 Mar. 3, 2022

(30) Foreign Application Priority Data

| Aug. 25, 2020 | (JP) | ................................. 2020-141385 |
| Dec. 24, 2020 | (JP) | ................................. 2020-215487 |
| Mar. 8, 2021 | (JP) | ................................. 2021-036278 |
| Jul. 27, 2021 | (JP) | ................................. 2021-122542 |

(51) Int. Cl.
| H01L 33/56 | (2010.01) |
| H01L 33/00 | (2010.01) |
| H01L 33/22 | (2010.01) |
| H01L 33/58 | (2010.01) |
| H01L 33/62 | (2010.01) |

(52) U.S. Cl.
CPC ............ *H01L 33/56* (2013.01); *H01L 33/005* (2013.01); *H01L 33/22* (2013.01); *H01L 33/58* (2013.01); *H01L 33/62* (2013.01); *H01L 2933/005* (2013.01); *H01L 2933/0066* (2013.01)

(58) Field of Classification Search
CPC ............... H01L 33/52–56; H01L 33/58; H01L 2933/005
See application file for complete search history.

(56) References Cited

U.S. PATENT DOCUMENTS

| 5,893,633 A | 4/1999 | Uchio et al. |
| 7,821,023 B2 | 10/2010 | Yuan et al. |
| 7,956,378 B2 | 6/2011 | Son |

(Continued)

FOREIGN PATENT DOCUMENTS

| JP | S 53-22669 U | 2/1978 |
| JP | S 54-93382 A | 7/1979 |

(Continued)

OTHER PUBLICATIONS

U.S. Office Action issued in corresponding U.S. Appl. No. 17/410,179 dated Oct. 6, 2023.

*Primary Examiner* — Jay C Chang
*Assistant Examiner* — Mikka Liu
(74) *Attorney, Agent, or Firm* — SQUIRE PATTON BOGGS (US) LLP

(57) ABSTRACT

A light emitting device includes a package for surface mounting including a plurality of leads, three leads of the plurality of leads respectively including an exposed region exposed from the dark-colored resin at a primary surface of the package, with first to third recesses each defined in the exposed region of a respective one of the three leads; first to third light emitting elements configured to emit first to third light, respectively; and a mold resin including first to third lens portions overlapping with the first to third recesses and the first to third light emitting elements, respectively, in a plan view, and colored in a similar color as the first to third light, respectively.

15 Claims, 12 Drawing Sheets

(56) References Cited

U.S. PATENT DOCUMENTS

| | | |
|---|---|---|
| 8,207,546 B2 | 6/2012 | Harada et al. |
| 8,614,451 B2 | 12/2013 | Hanya |
| 8,740,411 B2 | 6/2014 | Yong et al. |
| 8,937,324 B2 | 1/2015 | Helbing et al. |
| 2003/0168720 A1 | 9/2003 | Kamada |
| 2004/0188700 A1 | 9/2004 | Fukasawa et al. |
| 2008/0298063 A1 | 12/2008 | Hayashi |
| 2010/0065879 A1 | 3/2010 | Kirsch et al. |
| 2010/0244059 A1* | 9/2010 | Iida et al. ............... H01L 24/19 |
| | | 257/E33.044 |
| 2012/0162998 A1 | 6/2012 | Takahashi et al. |
| 2013/0126935 A1 | 5/2013 | Zitzlsperger et al. |
| 2014/0291716 A1 | 10/2014 | Ukawa |
| 2020/0098957 A1 | 3/2020 | Pang et al. |
| 2020/0176643 A1* | 6/2020 | Pang ....................... H01L 33/62 |
| 2020/0313058 A1 | 10/2020 | Ukawa et al. |
| 2022/0069181 A1 | 3/2022 | Mitsuyama |
| 2022/0310567 A1* | 9/2022 | Pang ....................... H01L 33/486 |

FOREIGN PATENT DOCUMENTS

| | | |
|---|---|---|
| JP | H 05-50754 A | 7/1993 |
| JP | H 07-211937 A | 8/1995 |
| JP | H 09-162446 A | 6/1997 |
| JP | H 10-12926 A | 1/1998 |
| JP | H 10-173242 A | 6/1998 |
| JP | 2001-36150 A | 2/2001 |
| JP | 2002/009345 A | 1/2002 |
| JP | 2002-110864 A | 4/2002 |
| JP | 2002-223005 A | 8/2002 |
| JP | 2003-332634 A | 11/2003 |
| JP | 2005-217308 A | 8/2005 |
| JP | 2007-173562 A | 7/2007 |
| JP | 2008-311246 A | 12/2008 |
| JP | 2010-114141 A | 5/2010 |
| JP | 2010-114406 A | 5/2010 |
| JP | 2010-519775 A | 6/2010 |
| JP | 2010-206138 A | 9/2010 |
| JP | 2011-222712 A | 11/2011 |
| JP | 5233170 B2 | 7/2013 |
| JP | 2013-534719 A | 9/2013 |
| JP | 2014-209602 A | 11/2014 |
| JP | 2020-170737 A | 10/2020 |
| WO | WO 2012/090576 A1 | 7/2012 |

* cited by examiner

SURFACE-MOUNTED MULTI-COLORED LIGHT EMITTING DEVICE

CROSS-REFERENCE TO RELATED APPLICATIONS

This application claims priority to Japanese Patent Application No. 2020-141385, filed on Aug. 25, 2020, Japanese Patent Application No. 2020-215487, filed on Dec. 24, 2020, Japanese Patent Application No. 2021-036278, filed on Mar. 8, 2021, and Japanese Patent Application No. 2021-122542, filed on Jul. 27, 2021. The contents of these applications are hereby incorporated by reference in their entirety.

BACKGROUND

The present disclosure relates to a light emitting device.

As a light emitting device including a light emitting diode (LED), a shell type (lamp type) light emitting device, a surface mounting type (SMD type) light emitting device, and the like are known. Because lamp type light emitting devices have high directionality in a frontward direction, such light emitting devices are preferably used for large display devices, such as an LED display device, in which light emitting devices are arranged in a matrix pattern as pixels.

A lamp type light emitting device is typically mounted on a printed circuit board or the like by flow soldering. Therefore, when a lamp type light emitting device is used, costs and manufacturing steps required for mounting may increase compared to a case of using an SMD type light emitting device that is to be surface-mounted by reflow soldering.

In view of this, for example, JP H7-211937 A proposes a light emitting device that can be mounted by reflow soldering.

SUMMARY

One exemplary and non-limiting embodiment of the present disclosure provides a multi-color light emitting device that can extract light with a high efficiency in a frontward direction and that can be surface mounted.

A light emitting device according to one embodiment of the present disclosure includes a package for surface mounting, the package including a plurality of leads and a dark-colored resin securing at least some of the plurality of leads, three leads of the plurality of leads respectively including an exposed region exposed from the dark-colored resin at a primary surface of the package, with a first recess, a second recess, and a third recess each being defined in the exposed region of a respective one of the three leads; a plurality of light emitting elements including a first light emitting element disposed in the first recess and configured to emit first light, a second light emitting element disposed in the second recess and configured to emit second light having a wavelength shorter than a wavelength of the first light, and a third light emitting element disposed in the third recess and configured to emit third light having a wavelength shorter than a wavelength of the second light; and a mold resin sealing the plurality of light emitting elements. The mold resin includes a base portion covering the primary surface of the package and the plurality of light emitting elements, and a plurality of lens portions formed integrally with the base portion. Each of the plurality of lens portions has a convex shape protruding upwardly from the base portion. In a plan view, the plurality of lens portions include a first lens portion overlapping with the first recess and the first light emitting element, a second lens portion overlapping with the second recess and the second light emitting element, and a third lens portion overlapping with the third recess and the third light emitting element. The first lens portion is colored in a similar color as the first light, the second lens portion is colored in a similar color as the second light, and the third lens portion is colored in a similar color as the third light.

A light emitting device according to one embodiment of the present disclosure includes a package for surface mounting, the package including a plurality of leads, and a dark-colored resin securing at least some of the plurality of leads, each of the plurality of leads including an exposed region exposed from the dark-colored resin at a primary surface of the package, with a first recess, a second recess, and a third recess that are defined in the exposed portions, two recesses of the first to third recesses being defined in the exposed region of one lead of the plurality of leads, and the other one recess of the first to third recesses being defined in the exposed region of the one lead or another lead of the plurality of leads; a plurality of light emitting elements including a first light emitting element disposed in the first recess and configured to emit first light, a second light emitting element disposed in the second recess and configured to emit second light having a wavelength shorter than a wavelength of the first light, and a third light emitting element disposed in the third recess and configured to emit third light having a wavelength shorter than a wavelength of the second light; and a mold resin configured to seal the plurality of light emitting elements. The mold resin includes a base portion covering the primary surface of the package and the plurality of light emitting elements, and a plurality of lens portions formed integrally with the base portion. Each of the plurality of lens portions has a convex shape protruding upwardly from the base portion. In a plan view, the plurality of lens portions include a first lens portion overlapping with the first recess and the first light emitting element, a second lens portion overlapping with the second recess and the second light emitting element, and a third lens portion overlapping with the third recess and the third light emitting element. The first lens portion is colored in a similar color as the first light, the second lens portion is colored in a similar color as the second light, and the third lens portion is colored in a similar color as the third light.

A method of manufacturing a light emitting device according to one embodiment of the present disclosure includes providing a first structure including a package including a plurality of leads, and a plurality of light emitting elements mounted on a primary surface of the package; and forming a mold resin sealing the plurality of light emitting elements in the first structure. The forming of the mold resin includes providing a casting case defining an upper cavity and a plurality of lower cavities each protruding downwardly from a base surface defining the upper cavity, injecting a first resin, which contains a thermosetting resin as a base material, into each of the plurality of lower cavities, such that the first resin injected into at least two of the plurality of lower cavities being colored in mutually different colors, semi-curing the first resin by heating the first resin at a temperature lower than a curing temperature of the first resin, injecting a second resin, which contains the same thermosetting resin as that of the first resin or a different thermosetting resin from that of the first resin as a base material, into the upper cavity, after semi-curing the first resin, and fully curing the second resin and the semi-cured first resin, in a state in which the plurality of light emitting elements and the primary surface of the package in the first structure are immersed in the second resin with each of the plurality of light emitting elements overlapping with a corresponding one of the plurality of lower cavities in a plan view, to obtain the mold resin including the base portion formed of the second resin and covering the primary surface of the package, and the plurality of lens portions formed of the first resin, the plurality of lens portions including at least two lens portions that are formed of the first resin and colored in mutually different colors.

According to certain embodiments of the present disclosure, it is possible to provide a multi-color light emitting device that can extract light with a high efficiency in a frontward direction and that can be surface mounted.

DETAILED DESCRIPTION

Figure 1:
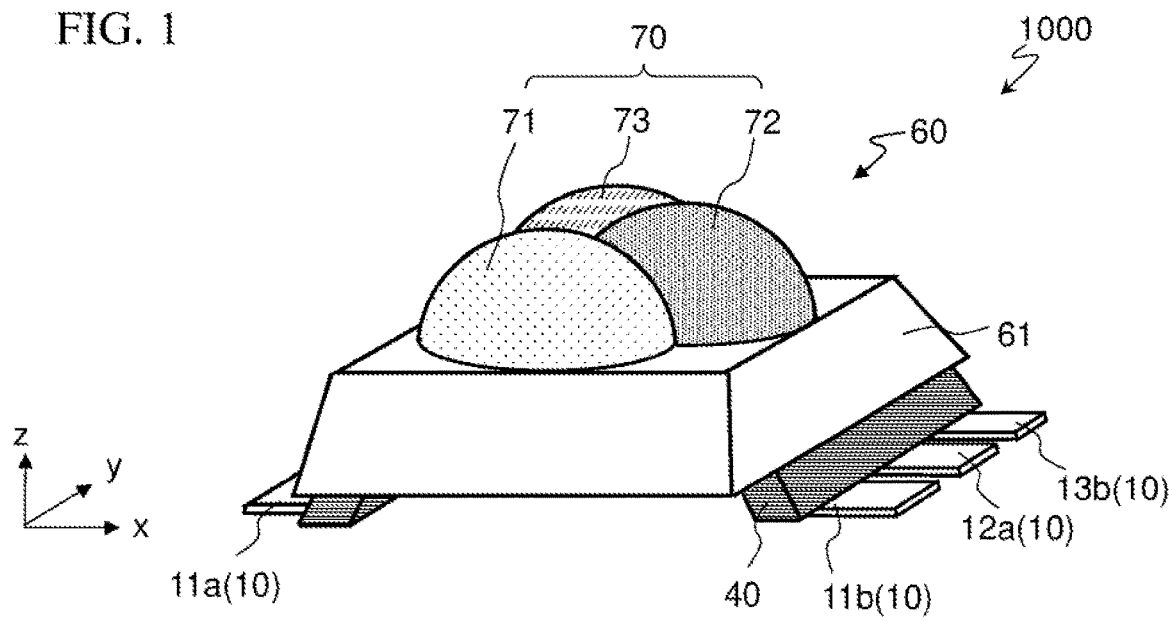
FIG. 1 is a schematic perspective view of a light emitting device according to one embodiment of the present disclosure.

Certain embodiments of the invention will be described below with reference to the drawings as appropriate. Light emitting devices to be described below are intended to embody technical idea of the present invention, and the present invention is not limited to the description below unless otherwise specified. Further, the content described in one embodiment can also be applied to another embodiment or modified example. Furthermore, sizes, positional relationships, or the like of members illustrated in each of the drawings may be exaggerated for clarity of description.

In the description below, components having substantially the same function may be denoted by the same reference numerals and repetitive description thereof may be omitted. Also, components that are not referenced in the description may not be designated with reference numerals. In the following description, terms indicating a specific direction or position ("upper", "lower", "right", "left", and other terms including those terms) may be used. These terms are used merely to facilitate understanding relative directions or positions in the referenced drawing. As long as the relative direction or position is the same as that described in the referenced drawing using the term such as "upper" or "lower", in drawings other than the drawings of the present disclosure, actual products, manufacturing devices, and the like, components is not necessarily arranged in the same manner as in the referenced drawing.

Embodiment

Figure 2A:
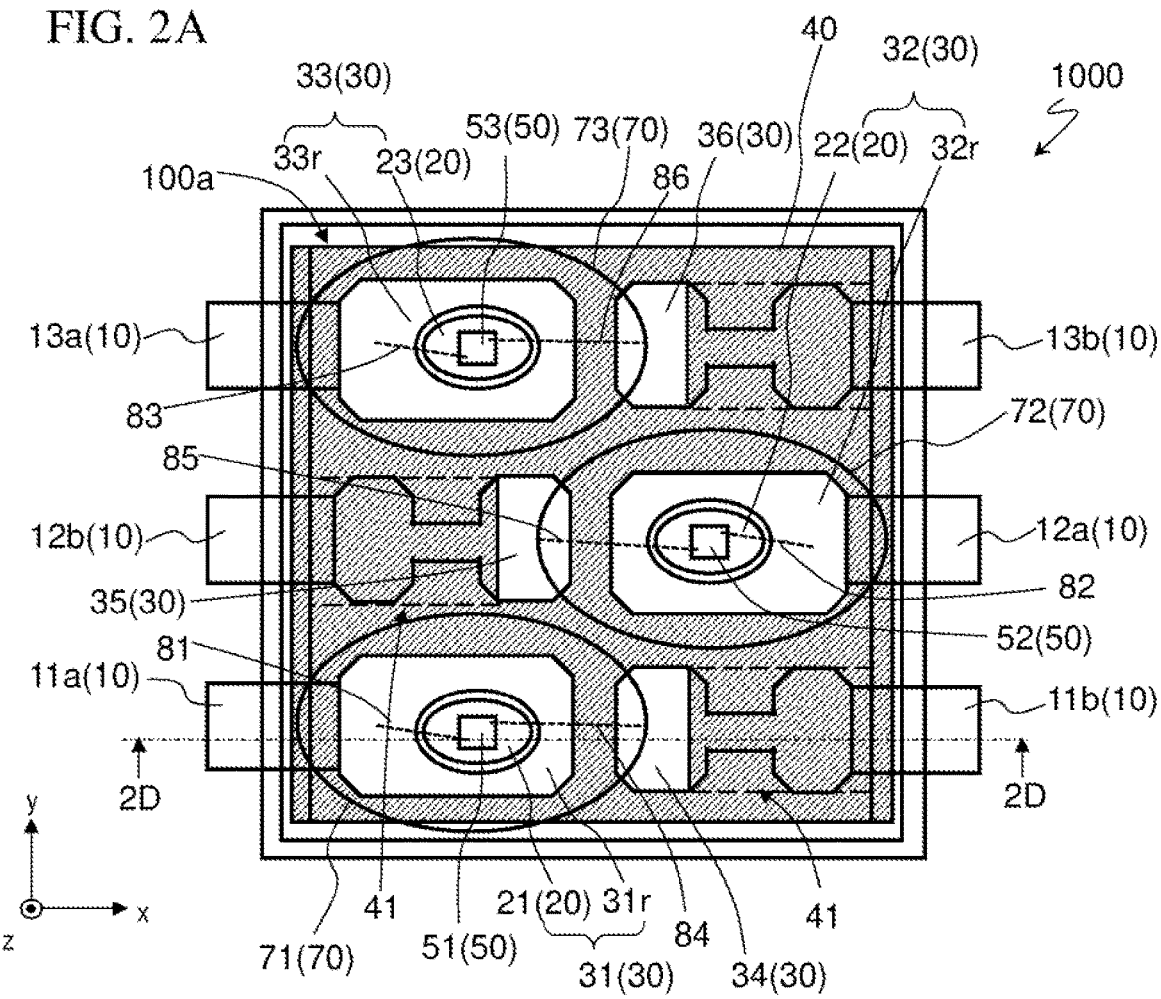
FIG. 2A is a schematic top plan view of the light emitting device illustrated in FIG. 1.

FIG. 1 is a schematic perspective view of a light emitting device 1000 according to one embodiment of the present disclosure. FIG. 2A is a schematic top plan view of the light emitting device 1000.

In FIG. 1, arrows indicating an x-axis, a y-axis, and a z-axis that are mutually orthogonal are illustrated together. Such arrows indicating these directions may also be illustrated in other drawings of the present disclosure. In a configuration exemplified in FIG. 1, an outer shape of the light emitting device 1000 is a generally rectangular shape in a top view. Each side of the rectangular outer shape is parallel to the x-axis or the y-axis illustrated in the drawing. The z-axis is perpendicular to the x-axis and the y-axis. The outer shape of the light emitting device 1000 is not necessarily a rectangular shape in a top view.

Figure 2B:
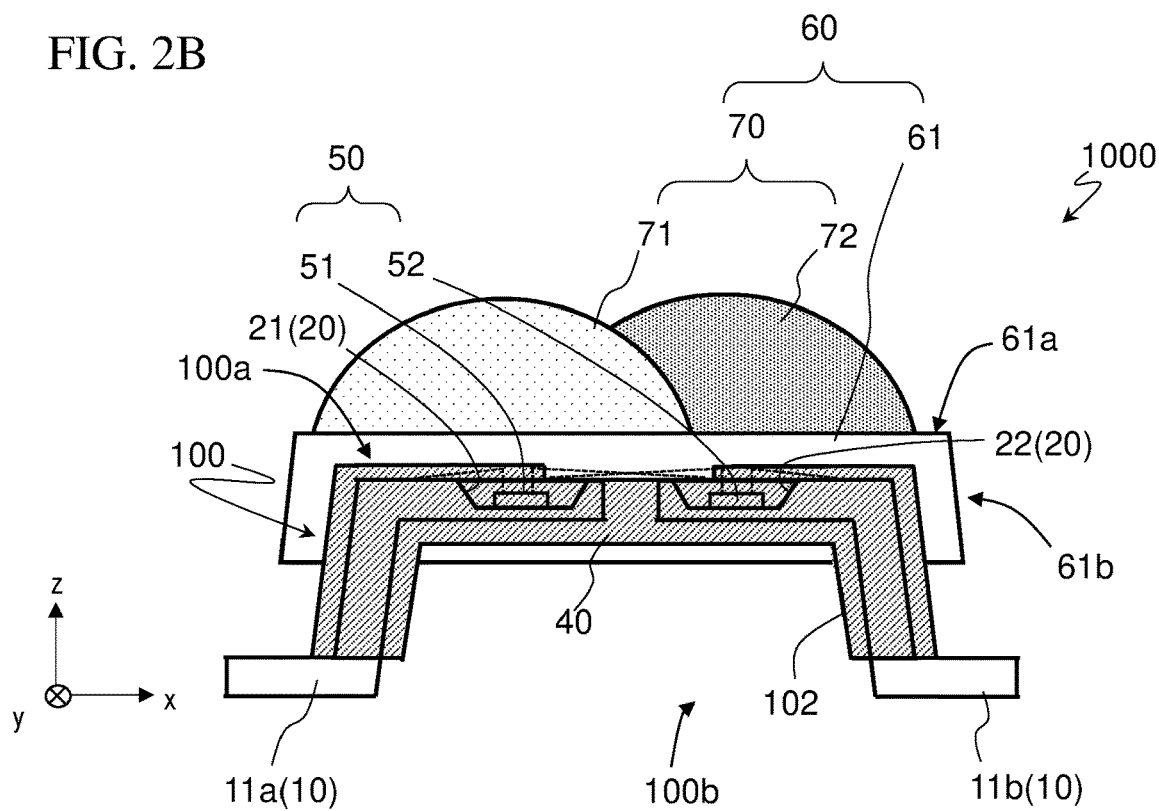
FIG. 2B is a schematic side view of the light emitting device illustrated in FIG. 1 when viewed in a y-axis direction.
Figure 2C:
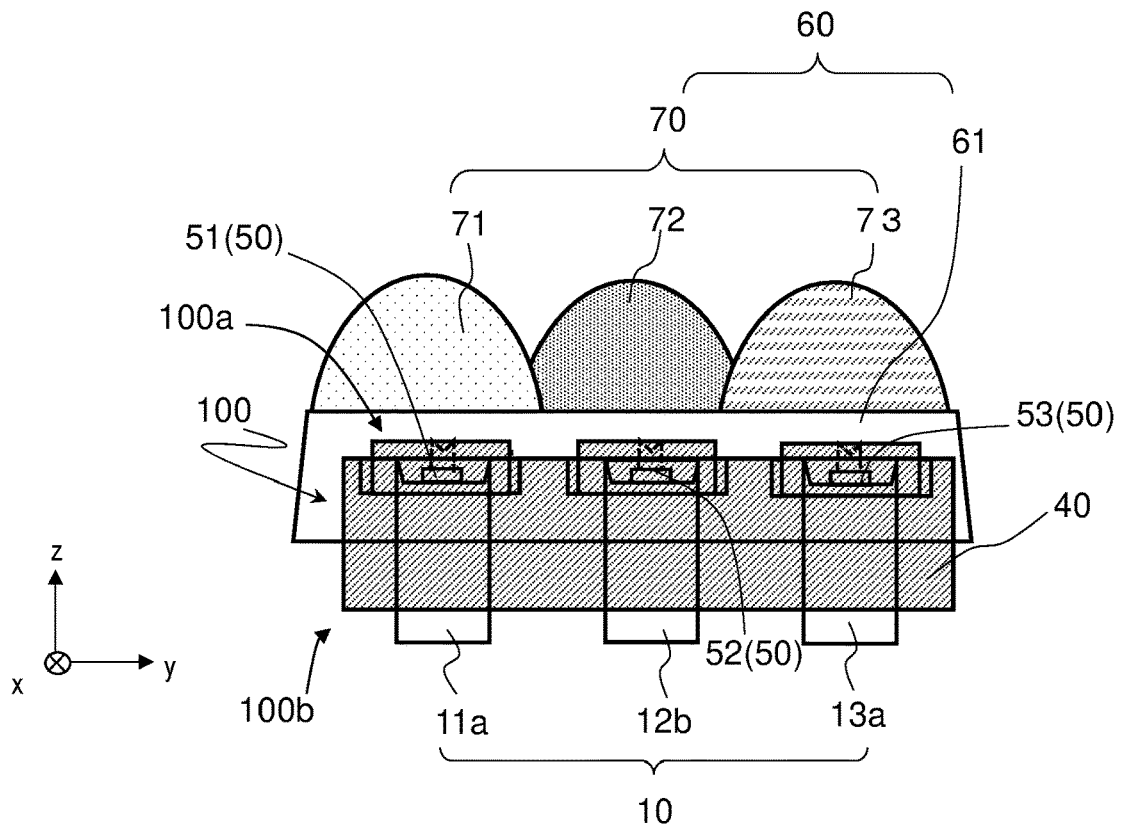
FIG. 2C is a schematic side view of the light emitting device illustrated in FIG. 1 when viewed in an x-axis direction.

FIG. 2B and FIG. 2C are schematic side views of the light emitting device 1000 illustrated in FIG. 1 when viewed from the y-axis direction and the x-axis direction, respectively.

As illustrated in FIG. 2B and FIG. 2C, the light emitting device 1000 includes a package 100 for surface mounting, a plurality of light emitting elements 50, and a mold resin 60 that seals the plurality of light emitting elements 50.

The package 100 includes a plurality of leads 10 and a dark-colored resin 40 (first dark-colored resin 40). At least one of the plurality of leads 10 defines a first recess 21, a second recess 22, and a third recess 23 (hereinafter these may be collectively referred to as "recesses 20") in each of which the light emitting element 50 is to be disposed. As illustrated in FIG. 2A, of the plurality of leads 10, each of three leads 10 may define a single recess 20. Alternatively, a single lead may define two or more recesses 20.

Each of the plurality of light emitting elements 50 is disposed in the corresponding single recess 20. The plurality of light emitting elements 50 includes a first light emitting element 51 configured to emit first light, a second light emitting element 52 configured to emit second light having a wavelength shorter than a wavelength of the first light, and a third light emitting element 53 configured to emit third light having a wavelength shorter than a wavelength of the second light. The first light emitting element 51 is disposed in the first recess 21. The second light emitting element 52 is disposed in the second recess 22. The third light emitting element 53 is disposed in the third recess 23.

The mold resin 60 includes a base portion 61 and a plurality of lens portions 70 that are integrally formed with the base portion 61. Each of the plurality of lens portions 70 is disposed above (on an emission side of) one corresponding light emitting element of the plurality of light emitting elements 50, and is colored in a similar color as a color of light emitted from the one corresponding light emitting element.

According to the present embodiment, the multi-color light emitting device 1000 is provided that includes the package 100 for surface mounting and that can be mounted by reflow soldering.

In the present embodiment, each of the light emitting elements 50 is disposed in a corresponding one of the recesses 20 of the lead 10, and the lens portions 70 are provided on the emission side of respective light emitting elements 50. With this structure, light can be extracted in the frontward direction with a higher efficiency than that of a conventional SMD type light emitting device. This will be described below in detail.

Furthermore, each of the lens portions 70 disposed on the emission side of a corresponding one of the light emitting elements 50 is colored in a similar color as a light emission color of the corresponding light emitting element 50. With this structure, when a light emitting element 50 is turned on, the light emission color is not obstructed, and when a light emitting element 50 is turned off, decrease in contrast due to reflection of external light in the periphery of the recess 20 in the lead 10 can be reduced. Further, when all of the first light emitting element 51, the second light emitting element 52, and the third light emitting element 53 are turned off, each of the lens portions 70 appears darker than the color in which a respective lens portion 70 is colored, that is, appears in a color of a lower brightness than that of the color with which the respective lens portion 70 is colored, due to subtractive color mixing of the colors of the three lens portions 70. Such an effect will be referred to as a "dark color effect". Since a light emission surface of the light emitting device 1000 appears darker due to the dark color effect, display contrast can be further improved.

Components of the light emitting device will be described in detail below.

Package 100

Figure 2D:
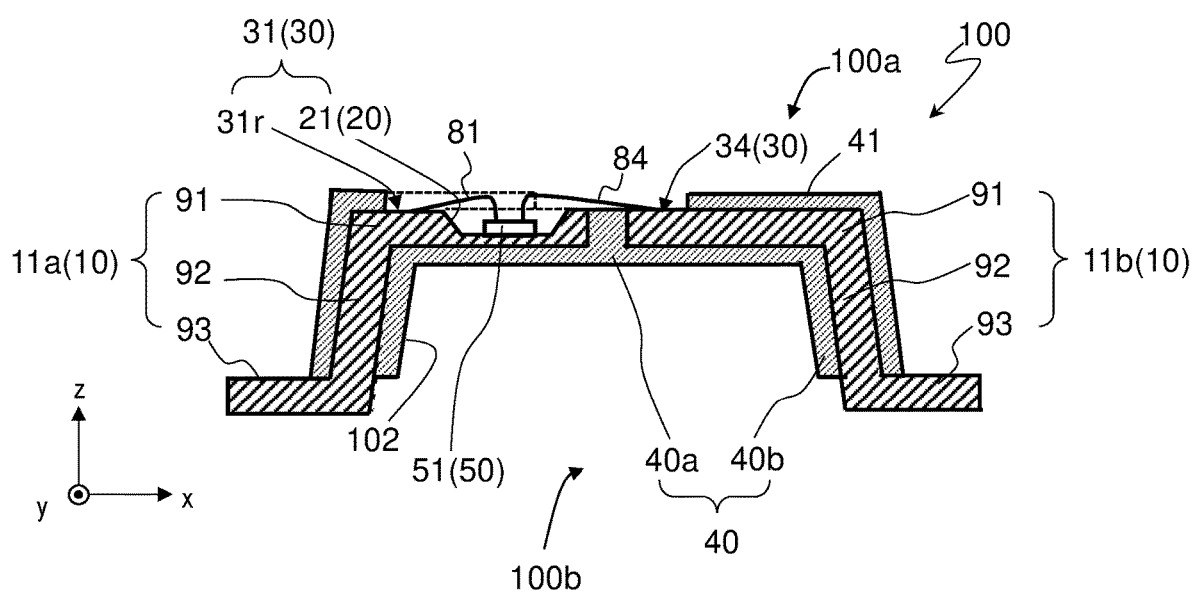
FIG. 2D is a schematic cross-sectional view, taken along line 2D-2D illustrated in FIG. 2A, of a package on which light emitting elements are mounted.

FIG. 2D is a schematic cross-sectional view of the package 100 and the light emitting element 50, taken along line 2D-2D illustrated in FIG. 2A.

The package 100 includes a primary surface 100a, and a back surface 100b opposite to the primary surface 100a. In a configuration exemplified in FIG. 2A, the primary surface 100a of the package 100 has a quadrangular shape in a top view. Each side of the quadrangular primary surface 100a is parallel to the x-axis or the y-axis. In a top view, the primary surface 100a may have a shape other than the quadrangular shape, such as a substantially triangular shape, a substantially quadrangular shape, a substantially pentagonal shape, a substantially hexagonal shape, another polygonal shape, or a shape including a curved line such as a circular shape or an elliptical shape.

The back surface 100b of the package 100 includes a mounting surface of each of the leads 10. The mounting surface is used when fixing the light emitting device 1000 to a mounting substrate. A recess 102 may be defined in the back surface 100b of the package 100. In the example herein, the recess 102 having a truncated quadrangular pyramid shape is defined.

The package 100 includes the plurality of leads 10 and the dark-colored resin 40 that secures at least some of the plurality of leads 10. The dark-colored resin 40 is integrally molded with the plurality of leads 10. The package 100 may be formed by transfer molding, insert molding, or the like.

Lead 10

Each of the plurality of leads 10 is conductive, and functions as an electrode for supplying power to a corresponding light emitting element 50.

In a configuration exemplified in FIG. 2D, each of the plurality of leads 10 is bent so as to include a first portion 91 including a portion exposed at the primary surface 100a of the package 100, a third portion 93 positioned at a side of the back surface 100b of the package 100, and a second portion 92 positioned between the first portion 91 and the third portion 93 and extending along a lateral surface of the package 100. The third portion 93 may extend outwardly from the lateral surface of the package 100, or may extend inwardly. The third portion 93 has a back surface exposed at the back surface 100b of the package 100 and serving as the mounting surface used when securing the light emitting device 1000 to the mounting substrate.

Each of the plurality of leads 10 includes an exposed region 30 exposed from the dark-colored resin 40 at the primary surface 100a of the package 100. The exposed region 30 is used for wire bonding for electrical connection with a corresponding light emitting element 50.

At least one of the plurality of leads 10 defines the first recess 21, the second recess 22, and the third recess 23. The first light emitting element 51 is mounted in the first recess 21. Similarly, the second light emitting element 52 and the third light emitting element 53 are mounted in the second recess 22 and the third recess 23, respectively.

The first recess 21, the second recess 22, and the third recess 23 are defined in at least one of the exposed regions 30 of the plurality of leads 10.

Each of the first recess 21, the second recess 22, and the third recess 23 may be defined in the exposed region 30 of a respective one of three different leads 10. With this structure, heat dissipation paths of the first light emitting element 51, the second light emitting element 52, and the third light emitting element 53 can be separated from each other, so that heat generated by each of the light emitting elements 50 can be efficiently dissipated.

Alternatively, at least two recesses, of the first recess 21, the second recess 22, and the third recess 23, may be defined in the exposed region 30 of one of the leads 10. With this structure, a gap between the at least two recesses 20 can be narrowed, so that the size of the package 100 can be reduced. For example, all of the first recess 21, the second recess 22, and the third recess 23 may be defined in one of the leads 10. Alternatively, two recesses of the first, second, and third recesses 21, 22, and 23, may be defined in one of the leads 10, and the remaining one of the first, second, and third recesses 21, 22, and 23 may be defined in another of the leads 10. In other words, two recesses of the first, second, and third recesses 21, 22, and 23, may be defined in the exposed region 30 of one of the plurality of leads 10, and the remaining one of the first, second, and third recesses 21, 22, and 23 (that is, one recess of the recesses that is other than the two recesses) may be defined in the exposed region 30 of the one of the leads 10 or of the other of the leads 10.

The recess 20 may have a circular shape or an elliptical shape in a plan view. In the example illustrated in FIG. 2A, the recess 20 has an elliptical shape having a major axis extending in the x-axis direction. With the shape of the recess 20 and the shape of the lens portion 70 to be described below, directional characteristics can be different between the x-axis direction and the y-axis direction. In a plan view, the recess 20 may have a shape other than the circular shape or the elliptical shape.

Each of the plurality of leads 10 is electrically connected to at least one of the light emitting elements 50 via wires. In the present specification, a portion, of the exposed region 30 of each lead 10, to which a wire is connected is referred to as a "wire connection portion". Each of the leads 10 includes at least one of the wire connection portions in a region of the exposed region 30 excluding the first recess 21, the second recess 22, and the third recess 23. The wire connection portion may be located in a portion, of the exposed region 30 of each of the leads 10, that is covered by the lens portion 70. [0038] The surface roughness of the region of the exposed regions 30 of each of the plurality of leads 10 excluding the first recess 21, the second recess 22, and the third recess 23 may be greater than the surface roughness of a region of each of the plurality of leads 10 other than the exposed region 30. With this structure, light such as external light incident on the primary surface 100a of the package 100 can be scattered. Accordingly, reflection of the external light is reduced, and thus, the deterioration in contrast due to the reflection of the external light can be reduced.

Each of the plurality of leads 10 may include a metal layer, such as a plating layer, in a surface thereof. The lead 10 may have any appropriate glossiness (when the lead 10 includes a metal layer such as a plating layer, glossiness of the metal layer). For example, a glossiness G1 of surfaces defining the first recess 21, surfaces defining the second recess 22, and surfaces defining the third recess 23 of the exposed regions 30 of corresponding one or more of the plurality of leads 10, a glossiness G2 of the region of the exposed region 30 excluding the first recess 21, the second recess 22, and the third recess 23, and a glossiness G3 of the region of each of the plurality of leads 10 other than the exposed region 30, that is, a region covered by the dark-colored resin 40 on the surface of the plurality of leads 10, may be respectively set. Adjustment of the glossiness of each of such regions of the lead 10 allows for improving brightness while reducing the reflection of the external light of the light emitting device 1000. The glossiness of each of the regions can be adjusted, for example, by adjusting the surface roughness of each of the regions. More specifically, the glossiness of a region, of the surface of the lead 10, having a larger surface roughness is lower than the glossiness of a region, of the surface of the lead 10, having a smaller surface roughness. When each of the plurality of leads 10 includes a metal layer such as a plating layer in a surface thereof, the glossiness of each of the regions can be adjusted, for example, by adjusting the roughness of a base material of the plurality of leads 10 (an underlayer for the plating layer), or an amount of a gloss agent added to a plating solution.

The glossiness G1 of the surfaces defining the first recess 21, the surfaces defining the second recess 22, and the surfaces defining the third recess 23 of the exposed region 30 is preferably selected in a range of 0 to 2.0 in accordance with desired directional characteristics. When the glossiness G1 is low, light emitted from the light emitting element 50 disposed in each of the recesses 20 of the leads 10 is scattered on the surfaces defining the recess 20, so that a directional angle can be widened. To widen the directional angle more effectively, the glossiness G1 is, for example, preferably 0 or greater and less than 0.8. On the other hand, when the glossiness G1 is high, the light emitted from the light emitting element 50 disposed in each of the recesses 20 is less likely to be scattered on the surfaces defining the recess 20, the directional angle can be narrow. Narrowing the directional angle allows for improving a light extraction efficiency in the frontward direction. To effectively improve the light extraction efficiency, the glossiness G1 is, for example, preferably 0.8 or greater.

The glossiness G2 of the region of the exposed region 30 excluding the first recess 21, the second recess 22, and the third recess 23 is preferably set to be low in view of improving contrast. With a low glossiness G2, external light such as sunlight can be scattered on a surface of the lead 10, so that the decrease in contrast due to the reflection of the external light can be reduced. The glossiness G2 is preferably 0 or greater and 0.2 or less, for example. The glossiness G2 may be lower than the glossiness G1. For example, by setting a surface roughness of the region of the exposed region 30 excluding the recesses 20 to be greater than the surface roughness of surfaces defining each of the recesses 20, the glossiness G2 can be lower than the glossiness G1. Any appropriate method may be used for partially varying the surface roughness of the leads 10. For example, a first plating layer may be disposed on a substrate such as a copper substrate (hereinafter referred to as a "lead substrate"), and a second plating layer having a different surface roughness from that of the first plating layer may be disposed on only a portion of the first plating layer. Accordingly, the surface roughness can be different between a portion in which the first plating layer is exposed and the portion on which the second plating layer is formed. This will be described below in detail.

The region covered by the dark-colored resin 40 on the surface of each of the plurality of leads 10 is preferably roughened so as to have the low glossiness G3. Roughening the region, of the surface of the lead 10, covered by the dark-colored resin 40 allows for increasing adhesion between the lead 10 and the dark-colored resin 40 can be improved. The glossiness G3 may be lower than the glossiness G1. The glossiness G3 may be similar to the glossiness G2. The glossiness G3 may be 0 or greater and 0.2 or less, for example.

The glossiness can be measured using various types of gloss meter. In the present specification, reflectivity Y of a surface of the lead 10 is measured in accordance with the method stipulated under Condition (a) of JIS Z 8722, and the glossiness is calculated from the reflectivity Y. A micro color meter VSR-300A available from Nippon Denshoku Industries is used for measuring the reflectivity Y.

Figure 9:
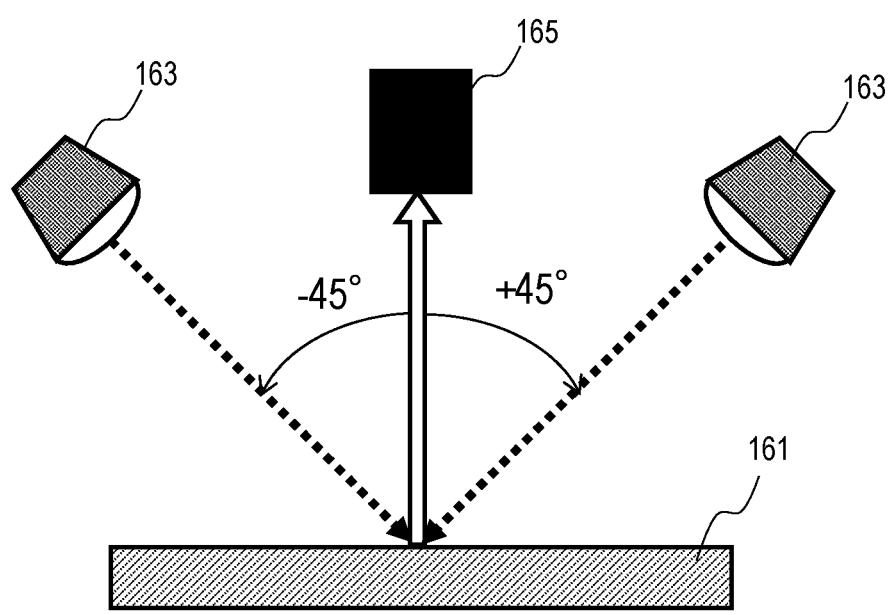
FIG. 9 is a schematic cross-sectional view illustrating a method for measuring reflectivity and glossiness.

FIG. 9 is a schematic cross-sectional view illustrating a method of measuring the reflectivity Y. As illustrated in FIG. 9, a sample 161 to be measured (the lead 10 in this case) is installed, and light sources 163 are disposed in directions respectively inclined by plus 45 degrees and minus 45 degrees, with respect to the normal of a surface of the sample 161. In addition, a photodetector 165 is disposed in a normal direction (a direction at an angle of 0 degrees with respect to the normal of the surface of the sample 161) of the sample 161. The reflectivity Y is measured by causing the light sources 163 to emit light to be incident on the sample 161 and receiving, with the photodetector 165, the light reflected at the sample 161 in the normal direction of the sample 161. The reflectivity Y is a percentage of the light reflected at the sample 161 in the normal direction of the sample 161, with respect to the incident light. The glossiness can be determined by 2−Log Y.

In the present embodiment, the plurality of leads 10 include a plurality of lead pairs. One of each lead pair may define the recess 20 in which a corresponding light emitting element 50 is disposed.

In the example illustrated in FIG. 2A, the plurality of leads 10 include a first lead 11a defining the first recess 21, a second lead 12a defining the second recess 22, and a third lead 13a defining the third recess 23.

The plurality of leads 10 further include a fourth lead 11b, a fifth lead 12b, and a sixth lead 13b. The first lead 11a and the fourth lead 11b constitute a first lead pair, the second lead 12a and the fifth lead 12b constitute a second lead pair, and the third lead 13a and the sixth lead 13b constitute a third lead pair, respectively. The first lead pair is electrically connected to the first light emitting element 51 via wires 81 and 84. The second lead pair is electrically connected to the second light emitting element 52 via wires 82 and 85. The third lead pair is electrically connected to the third light emitting element 53 via wires 83 and 86.

Each of the first lead 11a, the second lead 12a, the third lead 13a, the fourth lead 11b, the fifth lead 12b, and the sixth lead 13b includes the exposed region 30 exposed at the primary surface 100a of the package 100. In the present specification, the exposed regions 30 of the first lead 11a, the second lead 12a, the third lead 13a, the fourth lead 11b, the fifth lead 12b, and the sixth lead 13b will be referred to as a "first region 31", a "second region 32", a "third region 33", a "fourth region 34", a "fifth region 35", and a "sixth region 36", respectively.

The first region 31 includes the first recess 21, and a peripheral portion 31r positioned around the first recess 21. The peripheral portion 31r refers to a region of the first region 31 excluding the first recess 21. Similarly, the second region 32 includes the second recess 22, and a peripheral portion 32r positioned around the second recess 22, and the third region 33 includes the third recess 23, and a peripheral portion 33r positioned around the third recess 23.

The surface roughness of the peripheral portion 31r of the first region 31 may be greater than the surface roughness of a region of the first lead 11a excluding the first region 31. Similarly, the surface roughness of the peripheral portion 32r of the second region 32 and the surface roughness of the peripheral portion 33r of the third region 33 may be greater than the surface roughness of a region of the second lead 12a excluding the second region 32 and the surface roughness of a region of the third lead 13a excluding the third region 33, respectively.

The first recess 21, the second recess 22, and the third recess 23 may be arranged in a first direction (the y-axis direction in this case) in a plan view. Alternatively, as exemplified in FIG. 2A, the first recess 21, the second recess 22, and the third recess 23 may be arranged such that a center of a central one of the first recess 21, the second recess 22, and the third recess 23 in the x-axis direction or the y-axis direction (the second recess 22 in the example herein) is not positioned on a line connecting the centers of the other two recesses. With this arrangement, the first light emitting element 51, the second light emitting element 52, and the third light emitting element 53 can be disposed closer to each other. In addition, the area of the primary surface 100a of the package 100 can be reduced.

In a configuration exemplified in FIG. 2A, in the primary surface 100a of the package 100, the first lead pair, the second lead pair, and the third lead pair are arrayed in the y-axis direction. In the primary surface 100a, end portions of the two leads constituting each lead pair are separated from each other and disposed facing each other. For example, in the primary surface 100a, in the first lead pair, the first lead 11a defining the first recess 21 is positioned on the left side (the negative x side) with respect to the fourth lead 11b. In the third lead pair as well, the third lead 13a defining the third recess 23 is positioned on the left side (the negative x side) with respect to the sixth lead 13b. On the other hand, in the second lead pair, the second lead 12a defining the second recess 22 is positioned on the right side (the positive x side) with respect to the fifth lead 12b. With a positional relationship of the two leads forming each of the lead pairs that is different from that of the other adjacent lead pair, the three recesses 20 in which the light emitting elements 50 are to be mounted can be arranged offset from each other.

Each lead 10 may be constituted of the substrate and the metal layer covering the surface of the substrate. Examples of the substrate include metals such as copper, aluminum, gold, silver, iron, nickel, alloys thereof, phosphor bronze, ferrous copper, and the like. The substrate may have a single-layer structure or a layered structure (a clad material, for example). Copper may be used for the substrate. The metal layer is, for example, a plating layer. Examples of the metal layer include silver, aluminum, nickel, palladium, rhodium, gold, copper, and alloys thereof. When the lead 10 includes such a metal layer, light reflection properties and/or bonding properties with metal wires (to be described below) and the like of the lead 10 can be improved.

Dark-Colored Resin 40

The dark-colored resin 40 has insulating properties for electrically isolating the light emitting elements 50 from the outside. At least a portion of the dark-colored resin 40 positioned at a side of the primary surface 100a of the package 100, that is, on a light emission observation surface side, is colored in a dark color such as black or gray. The entire dark-colored resin 40 may be colored in the dark color. With this structure, in the primary surface 100a of the package 100, the decrease in contrast due to the reflection of the external light and the like can be reduced. In the present specification, the "dark color" refers to a color having a brightness of 4.0 or less in the Munsell color system (20 hues). The "dark color" may have any appropriate hue, and the saturation thereof may be appropriately determined when necessary.

As illustrated in FIG. 2D, the dark-colored resin 40 includes, for example, a first resin portion 40a that is substantially parallel to the primary surface 100a of the package 100, and a second resin portion 40b that extends from the primary surface 100a toward the back surface 100b. The first portion 91 of each of the leads 10 is held by the first resin portion 40a, and the second portion 92 is held by the second resin portion 40b. At least the mounting surface of the third portion 93 of each of the leads 10 is exposed from the dark-colored resin 40. It is sufficient that the dark-colored resin 40 have a shape with which the dark-colored resin 40 can hold the plurality of leads 10, and the dark-colored resin 40 may have a shape other than that illustrated in the drawings.

The dark-colored resin 40 is disposed such that a portion, of each of the leads 10, used for the wire bonding is exposed in the primary surface 100a of the package 100. In this example, as illustrated in FIG. 2A, the dark-colored resin 40 is disposed such that the first region 31 of the first lead 11a, the second region 32 of the second lead 12a, the third region 33 of the third lead 13a, the fourth region 34 of the fourth lead 11b, the fifth region 35 of the fifth lead 12b, and the sixth region 36 of the sixth lead 13b are exposed from the dark-colored resin 40 in the primary surface 100a of the package 100. In the primary surface 100a of the package 100, the dark-colored resin 40 may partially cover at least some of the leads 10. In the configuration illustrated in FIG. 2A or the like, the dark-colored resin 40 includes protrusions 41 each covering a corresponding one of a portion of the fourth lead 11b, a portion of the fifth lead 12b, and a portion of the sixth lead 13b. With this structure, an exposed area of the lead 10 can be reduced, so that the reflection of the external light can be further reduced. Alternatively, although not illustrated, the dark-colored resin 40 may define openings in the primary surface 100a of the package 100, each of the openings exposing the first region 31, the second region 32, the third region 33, the fourth region 34, the fifth region 35, and the sixth region 36, respectively.

For a material of the dark-colored resin 40, a material having a small coefficient of thermal expansion and a great adhesion with the mold resin 60 may be selected. The coefficient of thermal expansion of the dark-colored resin 40 may be substantially equal to the coefficient of thermal expansion of the mold resin 60, or may be smaller than the coefficient of thermal expansion of the mold resin 60, in consideration of an influence of heat from the light emitting elements 50.

For the dark-colored resin 40, for example, a thermoplastic resin can be used. Examples of the thermoplastic resin include thermoplastic resins such as an aromatic polyamide resin, a polyphthalamide resin (PPA), a sulfone resin, a polyamide-imide resin (PAI), a polyketone resin (PK), a polycarbonate resin, polyphenylene sulfide (PPS), a liquid crystal polymer (LCP), an ABS resin, and a PBT resin, can be used. A thermoplastic resin containing glass fibers may also be used as a thermoplastic material. With the glass fibers contained in the thermoplastic resin, it is possible to form a package having a high rigidity and a high strength. In the present specification, the "thermoplastic resin" refers to a substance that has a linear polymer structure and that softens and then becomes liquid when heated and solidifies when cooled. Examples of such a thermoplastic resin include styrene-based, acrylic-based, cellulose-based, polyethylene-based, vinyl-based, polyamide-based, and fluorocarbon-based resins.

Alternatively, for the dark-colored resin 40, for example, a thermosetting resin such as a silicone resin, an epoxy resin, or the like may be used.

A colorant that colors the dark-colored resin 40 in the dark color may be added to the resin material of the dark-colored resin 40. Various dyes and pigments are preferably used for the colorant. Specific examples of the colorant include $Cr_2O_3$, $MnO_2$, $Fe_2O_3$, carbon black, and the like. An amount of the colorant to be added may be, for example, 0.3% or greater and 1.5% or less, and preferably 0.5% or greater and 1.0% or less with respect to the resin material that serves as the base material. In one example, as the thermoplastic resin material, a thermoplastic resin material in which a small amount of dark-colored particles such as carbon particles is added to the polyphthalamide (PPA) may be used.

Light Emitting Element 50

The light emitting element 50 is a semiconductor light emitting element such as a semiconductor laser or a light emitting diode. The emission wavelength of each of the light emitting elements 50 may be selected appropriately. The emission wavelength of each of the light emitting elements 50 may be selected so as to obtain white light or mixed-color light of a light bulb color when the plurality of light emitting elements 50 are turned on. For example, the first light emitting element 51 may be a red light emitting element configured to emit red light, the second light emitting element 52 may be a green light emitting element configured to emit green light, and the third light emitting element 53 may be a blue light emitting element configured to emit blue light. The combination of the number of light emitting elements and the light emission colors described herein is merely an example and is not limited to this example.

For the blue and green light emitting elements, light emitting elements using ZnSe or a nitride-based semiconductor ($In_XAl_YGa_{1-X-Y}N$, $0 \leq X$, $0 \leq Y$, $X+Y \leq 1$) can be used. For example, a light emitting element in which a semiconductor layer including GaN is disposed on a support substrate such as sapphire may be used. For the red-light emitting element, a GaAs-, AlInGaP-, or AlGaAs-based semiconductor or the like can be used. For example, a light emitting element in which a semiconductor layer including AlInGaP is formed on a support substrate such as silicon, aluminum nitride, or sapphire may be used. Furthermore, a semiconductor light emitting element made of other materials can be used. The composition, light emission color, size, number, and the like of the light emitting element can be selected as appropriate in accordance with an intended purpose.

Further, a phosphor adapted to convert wavelength of light emitted from a semiconductor chip can be disposed around the semiconductor chip constituted of a nitride-based semiconductor etc., which allows for obtaining any appropriate light emission. In the present specification, the "light emitting element 50" includes not only a semiconductor chip constituted of a nitride-based semiconductor etc., but also an element constituted of a semiconductor chip and the phosphor. Specific examples of the phosphor include yttrium-aluminum-garnet activated by cerium, lutetium-aluminum-garnet activated by cerium, nitrogen containing calcium aluminosilicate activated by europium and/or chromium (a portion of the calcium can be substituted with strontium), sialon activated by europium, silicate activated by europium, strontium aluminate activated by europium, potassium fluoride silicate activated by manganese, and the like. In one example, the each of first light emitting element 51, the second light emitting element 52, and the third light emitting element 53 may include a semiconductor chip configured to emit blue light. In this case, with the phosphor disposed around the semiconductor chip in each of at least two of those light emitting elements, the light emission colors of the first light emitting element 51, the second light emitting element 52, and the third light emitting element 53 can be different from each other.

The first light emitting element 51, the second light emitting element 52, and the third light emitting element 53 are bonded, respectively, to the base surface defining the first recess 21, the base surface defining the second recess 22, and the base surface defining the third recess 23 in at least one of the plurality of leads 10, using a bonding member such as a resin, solder, or a conductive paste.

Positive and negative electrodes of the first light emitting element 51 are electrically connected to portions, of the first lead 11a and the fourth lead 11b of the first lead pair, that are electrically connected to the primary surface 100a, respectively, by the wires 81 and 84, respectively. For example, one end portion of the wire 81 is connected to a region, of the first region 31 of the first lead 11a, other than the first recess 21, and the other end portion of the wire 81 is connected to one of the positive and negative electrodes of the first light emitting element 51. Further, one end portion of the wire 84 is connected to the fourth region 34 of the fourth lead 11b, and the other end portion of the wire 84 is connected to the other one of the positive and negative electrodes of the first light emitting element 51. Similarly, positive and negative electrodes of the second light emitting element 52 are connected to the second lead 12a and the fifth lead 12b of the second lead pair, respectively, by the wires 82 and 85, respectively. Positive and negative electrodes of the third light emitting element 53 are connected to the third lead 13a and the sixth lead 13b of the third lead pair, respectively, by the wires 83 and 86, respectively.

For the wires 81 to 86, metal wires made of gold, silver, copper, platinum, aluminum, or alloys thereof can be used. Among these, it is preferable to use a gold wire with high ductility, or a gold-silver alloy wire having a higher reflectivity than that of the gold wire.

Mold Resin

The mold resin 60 includes the base portion 61 and the plurality of lens portions 70. The base portion 61 and the lens portions 70 are integrally formed. As will be described below, the base portion 61 and the lens portions 70 may be integrally formed, for example, by using a casting technique.

Base Portion 61

The base portion 61 of the mold resin 60 covers the primary surface 100a of the package 100 and the plurality of light emitting elements 50. The base portion 61 serves to seal the light emitting elements 50, and to hold the lens portions 70 that are integrally formed with the base portion 61 in predetermined positions.

In the present embodiment, the base portion 61 includes, for example, an upper surface 61a positioned above the primary surface 100a of the package 100, and lateral surfaces 61b continuous with the upper surface 61a. In the illustrated example, the base portion 61 has a truncated quadrangular pyramid shape having the upper surface 61a, which is slightly larger than the upper surface of the dark-colored resin 40 of the package 100. The upper surface 61a of the base portion 61 includes a portion that is in contact with the lens portions 70 and a portion that does not overlap with the plurality of lens portions 70 in a plan view. The base portion 61 may cover not only the primary surface 100a of the package 100, but also at least a portion of the back surface 100b. In the example herein, a portion of the base portion 61 is disposed in the recess 102 defined in the back surface 100b of the package 100, and is in contact with a portion of the surface of the dark-colored resin 40 defining the recess 102. With the base portion 61 of the mold resin 60 located also on the back surface 100b of the package 100, detachment, shifting, and the like of the lens portions 70 can be reduced, so that the lens portions 70 can be held in a more stable manner. The base portion 61 may have any appropriate shape, light transmittance, and the like.

The base portion 61 may have any appropriate surface roughness, but in view of improving the display contrast, preferably has a great surface roughness. The surfaces of the base portion 61 may be entirely or partially roughened. At least the portion, of the upper surface 61a of the base portion 61, that does not overlap with the plurality of lens portions 70 in a plan view is preferably roughened. The lateral surfaces 61b of the base portion 61 may also be roughened. The surface roughness of the upper surface 61a and the surface roughness of the lateral surfaces 61b may be the same or different. In view of ease of processing, the surface roughnesses of the upper surface 61a and the lateral surfaces 61b are preferably the same. With the large surface roughness of the base portion 61, the external light such as sunlight can be scattered on the surface of the base portion 61, and the reflection intensity can be reduced. This structure allows for reducing decrease in contrast due to the reflection of the external light.

The surface roughness of the portion, of the upper surface 61a of the base portion 61, that does not overlap with the plurality of lens portions 70 in a plan view may be greater than, for example, a surface roughness of the lens portion 70. Such a structure is obtained, for example, by disposing the mold resin 60 including the base portion 61 and the lens portions 70, and then after that, performing roughening processing such as blasting on a predetermined region of the surface of the base portion 61. Alternatively, a casting case (see FIG. 4) whose inner surface is partially roughened may be used for forming the mold resin 60. As will be described below in detail, for example, roughening a portion of the inner surface of the casting case that forms the upper surface 61a of the base portion 61 allows for increasing the surface roughness of the portion, of the upper surface 61a of the base portion 61, that does not overlap with the plurality of lens portions 70 in a plan view.

An arithmetic mean roughness Ra of the upper surface 61a of the base portion 61 is preferably in a range of 0.4 μm or greater and 5 μm or less. More preferably, Ra is in a range of 0.8 μm or greater and 3 μm or less. The lateral surfaces 61b of the base portion 61 may also have Ra within the same range as the range described above. Ra can be measured in accordance with the method for measuring the surface roughness stipulated in JIS B 0601-2001. More specifically, Ra is expressed by the following equation, when a portion of a measurement length L is extracted from a roughness curve in the direction of the center line thereof, the center line of the extracted portion is represented by the x-axis, a direction of the longitudinal magnification is represented by the y-axis, and the roughness curve is represented by y=f(x).

$$R_a = \frac{1}{L}\int_0^L |f(x)|dx$$

A contact type surface roughness measuring device, a laser microscope, or the like can be used for measuring Ra. In the present specification, the laser microscope VK-250 available from Keyence is used.

The base portion 61 preferably has a light transmittance of 90% or greater at respective peak wavelengths of the plurality of light emitting elements 50. With this structure, the light extraction efficiency of the light emitting device 1000 can be further improved.

Lens Portion 70

In the mold resin 60, each of the plurality of lens portions 70 has a convex shape protruding upwardly from the base portion 61.

Each of the plurality of lens portions 70 is disposed corresponding to a respective one of the plurality of light emitting elements 50 in a one-to-one relationship. In the present embodiment, in a plan view, the plurality of lens portions 70 include a first lens portion 71 that covers the first recess 21 and the first light emitting element 51, a second lens portion 72 that covers the second recess 22 and the second light emitting element 52, and a third lens portion 73 that covers the third recess 23 and the third light emitting element 53. Thus, in a plan view, the first lens portion 71 overlaps with the first recess 21 and the first light emitting element 51, the second lens portion 72 overlaps with the second recess 22 and the second light emitting element 52, and the third lens portion 73 overlaps with the third recess 23 and the third light emitting element 53. Each of the lens portions 70 may further cover at least a portion of a corresponding exposed region 30, in which a corresponding light emitting element 50 is disposed, excluding the recess 20.

As illustrated in FIG. 2A, the first lens portion 71 may cover the entire first region 31, the second lens portion 72 may cover the entire second region 32, and the third lens portion 73 may cover the entire third region 33. In other words, in a plan view, the first lens portion 71 may overlap with the entire first region 31, the second lens portion 72 may overlap with the entire second region 32, and the third lens portion 73 may overlap with the entire third region 33. The first lens portion 71 may further cover at least a portion of the fourth region 34 of the fourth lead 11b. Similarly, the second lens portion 72 may cover at least a portion of the fifth region 35 of the fifth lead 12b and the third lens portion 73 may cover at least a portion of the sixth region 36 of the sixth lead 13b. In other words, in a plan view, the first lens portion 71 may further overlap with at least a portion of the fourth region 34 of the fourth lead 11b, the second lens portion 72 may overlap with at least a portion of the fifth region 35 of the fifth lead 12b, and the third lens portion 73 may overlap with at least a portion of the sixth region 36 of the sixth lead 13b.

The first lens portion 71 is colored in a similar color as the first light emitted from the first light emitting element 51. The second lens portion 72 is colored in a similar color as the second light emitted from the second light emitting element 52. The third lens portion 73 is colored in a similar color as the third light emitted from the third light emitting element 53. The first light emitted from the first light emitting element 51 is transmitted through the first lens portion 71 and exits from the emission surface of the light emitting device 1000. Similarly, the second light emitted from the second light emitting element 52 and the third light emitted from the third light emitting element 53 are transmitted through the second lens portion 72 and the third lens portion 73, respectively, and exit from the emission surface of the light emitting device 1000.

In the present specification, the term "similar colors" refers to colors within three adjacent ranges of each of the hue, the value, and the saturation in the color wheel of the Munsell color system (20 hues). In other words, colors of the same and both adjacent hues, values, and chromas in constant hue planes in the Munsell color system (20 hues) are referred to as being "similar color."

Each of the first lens portion 71, the second lens portion 72, and the third lens portion 73 has an elliptical shape in a plan view. The long axis of the elliptical shape is a long axis extending along a predetermined direction (the x-axis direction in this example). The shape and arrangement of each of the lens portions 70 in a plan view may be selected as appropriate in consideration of light distribution performance, light collection performance, and the like.

In the present embodiment, using the lens portion 70 disposed above (on the emission side of) each of the light emitting elements 50, the directional characteristics of the light emitting device 1000 can be controlled so as to be wide in the horizontal direction and narrow in the vertical direction. In the illustrated example, the lens portion 70 has the elliptical shape whose long axis extends in the x-axis direction in a plan view, so that the directional characteristics are obtained that are wide in the x-axis direction and narrow in the y-axis direction. The light emitting device 1000 having such directional characteristics may be particularly preferably used in a display device such as an LED display device.

The optical axes of the first lens portion 71, the second lens portion 72, and the third lens portion 73 may be aligned with the centers of the first recess 21, the second recess 22, and the third recess 23 each having a circular or elliptical shape, respectively. With this structure, controllability of the directional characteristics of the light emitting device 1000 can be further improved.

In a plan view, the first lens portion 71, the second lens portion 72, and the third lens portion 73 may be arranged in a single row. Alternatively, as exemplified in FIG. 2A, the first lens portion 71, the second lens portion 72, and the third lens portion 73 may be arranged such that the center of a central one of the first to third lens portions 71 to 73 in the x-axis direction or the y-axis direction (the second lens portion 72 in this example) is not positioned on a line connecting the centers of the other two lens portions. With such an offset arrangement of the lens portions 70, the size of the light emitting device 1000 can be reduced. Further, the first lens portion 71, the second lens portion 72, and the third lens portion 73 can be disposed closer to each other, so that the dark color effect arising from mixing of the three colors of the first lens portion 71, the second lens portion 72, and the third lens portion 73 can be further improved.

The lens portions 70 may have any appropriate surface roughness, but the surface roughness is preferably low in order to ensure the light extraction efficiency in the frontward direction. The surface roughness of the lens portion 70 may be less than the surface roughness of the upper surface 61a of the base portion 61. It is preferable that the lens portion 70 is not roughened. Ra of the lens portion 70 may be, for example, in a range of 0 μm or greater and 0.2 μm or less.

Material of Mold Resin 60

For a base material of the mold resin 60, a thermosetting resin, glass, or the like having high weather resistance and light-transmittance, such as an epoxy resin, a urea resin, and a silicone resin, is preferably used. The term "thermosetting resin" in the present specification refers to a plastic that cures when heated under pressure. Once cured, the thermosetting resin cannot be remelted or re-molded without losing its initial properties. Examples of such a thermosetting resin include epoxy-based resins, melamine-based resins, phenol-based resins, and urea-based resins.

A resin material serving as a base material of the base portion 61 and a resin material serving as a base material of the lens portion 70 may be the same or different from each other. The material of the lens portion 70 includes the resin material that serves as a base material thereof and a colorant for coloring the lens portion 70 in a predetermined color. The material of the base portion 61 does not necessarily contain the colorant used for coloring the lens portion 70.

Various dyes, pigments, and the like can be used as the colorant contained in the resin material of the lens portion 70. The colorant may be an inorganic material or an organic material. Specific examples of the colorant include perylene red, condensed azo red, quinacridone red, copper phthalocyanine blue, copper phthalocyanine green, curcumine, coal tar dyes, and the like. The content of the colorant may be, for example, 0.1% or greater, and preferably 0.2% or greater with respect to the resin material that forms the base material. With such a content, the display contrast can be more effectively improved due to the dark color effect. On the other hand, when the content of the colorant is increased, the light extraction efficiency may be reduced. Therefore, the content of the colorant may be 5% or less, and preferably 1% or less. The content of the colorant is not limited to the range described above, and is selected such that a high display contrast can be achieved while ensuring the light extraction efficiency.

The mold resin 60 according to the present embodiment may also contain a light diffusing material, in order to improve uniformity of quality of light of the light emitting device 1000 from multiple viewing directions. With the mold resin 60 containing the light diffusing material, light from the light emitting elements 50 can be diffused, and thus, unevenness in emission of the light emitting device 1000 can be reduced or prevented.

For such a light diffusing material, an inorganic material such as barium oxide, barium titanate, barium oxide, silicon oxide, titanium oxide, or aluminum oxide, or an organic material such as a melamine resin, a CTU guanamine resin, or a benzoguanamine resin is preferably used.

The mold resin 60 may contain various types of a filler that mitigates the internal stress of the resin. Although a specific material of the filler is similar to the light diffusing material, the central particle size ($D_{50}$) differs from that of the light diffusing material. In the present specification, the term "filler" refers to a filler whose central particle size is in a range of 100 nm or greater and 100 μm or less. When the filler having such a particle size is contained in a light-transmissive resin, color variation of the light emitting device 1000 can be improved by a light scattering effect, and further, heat shock resistance of the light-transmissive resin can be enhanced.

Effects, Etc.

The light emitting device 1000 according to the present embodiment has a structure that allows surface mounting by reflow soldering. Thus, mounting costs and the number of mounting steps can be reduced compared to a known lamp type light emitting device, which is mounted by flow soldering.

Further, according to the present embodiment, light can be extracted more efficiently than a conventional SMD type light emitting device. In a conventional SMD type light emitting device, a light emitting element is disposed in a recess defined, for example, in a resin package. Lateral surfaces and a base surface that define the recess are formed of white resin. In contrast, in the light emitting device 1000 of the present embodiment, each of the light emitting elements 50 is disposed in a corresponding recess 20 of the leads 10 formed of metal such as Ag. The recess 20 defined with the metal has a higher reflectivity than that of the recess defined with a white resin. Thus, according to the present embodiment, light emitted from the light emitting element 50 can be reflected in the frontward direction at the recess 20 defined with the metal, so that the light extraction efficiency in the frontward direction can be improved compared to a conventional SMD type light emitting device in which a light emitting element is disposed in a recess defined with the white resin. Therefore, the light emitting device 1000 of a high luminance can be obtained. Further, a similar luminance to that of a conventional SMD type light emitting device can be achieved with a smaller driving power, so that the operational life of the light emitting device 1000 can be extended.

Furthermore, in the present embodiment, the directional characteristics can be controlled by the light emitting elements 50 disposed in the recesses 20, and the lens portion 70 provided on the emission side of each of the light emitting elements 50. For example, in the configuration illustrated in FIG. 2A, in a plan view, both the recess 20 and the lens portion 70 have elliptical shapes whose long axis extends in the x-axis direction, and thus, the directional characteristics are obtained that are wide in the x-axis direction and narrow in the y-axis direction. With such control in the directional characteristics, the light extraction efficiency, in the frontward direction, of the light emitting device 1000 can be further improved. Therefore, according to the present embodiment, the light emitting device 1000 is obtained that has the directional characteristics suitable for the display device such as the LED display, and that has a further improved light extraction efficiency in the frontward direction (in other words, further improved luminance and life). While both the recess 20 and the lens portion 70 in the configuration illustrated in FIG. 2A have the elliptical shapes, as long as either the recess 20 or the lens portion 70 has the elliptical shape, the directional characteristics can be controlled.

In a conventional light emitting device, when a light emitting element is turned off, external light or the like incident on the light emitting device is reflected around the light emitting element, which may result in reduction in the display contrast. This problem is particularly pronounced when such conventional light emitting device is used in a large display device used outdoors, such as in a billboard. In contrast, according to the present embodiment, the display contrast can be improved. This will be described below in detail.

In the present embodiment, the first recess 21 and the first light emitting element 51 are covered by the first lens portion 71 colored in a similar color as the light emission color of the first light emitting element 51. With this structure, when the first light emitting element 51 is turned on, the light emission color is not obstructed, and when the first light emitting element 51 is turned off, the decrease in display contrast caused by the reflection of the external light in the first region 31 can be reduced. Similarly, with the second recess 22 and the second light emitting element 52 covered by the second lens portion 72 colored in a similar color as the light emission color of the second light emitting element 52, when the second light emitting element 52 is turned off, the decrease in the display contrast caused by the reflection of the external light in the second region 32 can be reduced. Further, the third recess 23 and the third light emitting element 53 are covered by the third lens portion 73 colored in a similar color as the light emission color of the third light emitting element 53, so that when the third light emitting element 53 is turned off, the decrease in the display contrast caused by the reflection of the external light in the third region 33 can be reduced.

Furthermore, when the first light emitting element 51, the second light emitting element 52, and the third light emitting element 53 are turned off, the subtractive color mixing of the color of the first lens portion 71, the color of the second lens portion 72, and the color of the third lens portion 73 occurs, so that each of the first lens portion 71, the second lens portion 72, and the third lens portion 73 appears darker than the color with which a respective lens portion is colored, that is, appears in a color of a lower brightness than that of the color with which the respective lens portion is colored. Accordingly, the light emission surface of the light emitting device 1000 appears darker, so that the display contrast can be further increased.

In the light emitting device 1000, when the first light emitting element 51, the second light emitting element 52, and the third light emitting element 53 are turned on, mixed light of a light transmitted through the first lens portion 71, a light transmitted through the second lens portion 72, and a light transmitted through the third lens portion 73 may be, for example, white light or light of a light bulb color. On the other hand, when the first light emitting element 51, the second light emitting element 52, and the third light emitting element 53 are turned off, each of the first lens portion 71, the second lens portion 72, and the third lens portion 73 may appear in a dark color, such as gray or black, for example, that is, in a color of a lower brightness than that of the color with which it is colored.

Method of Manufacturing Light Emitting Device 1000

An example of a method of manufacturing the light emitting device 1000 will be described below.

Each of FIGS. 3A to 3C and FIGS. 5A to 5C is a step cross-sectional view for describing the method of manufacturing the light emitting device 1000, and illustrates a cross section traversing the single light emitting element 50 in the x-axis direction with respect to the top view of the light emitting device 1000 illustrated in FIG. 2A. FIG. 4 is a schematic perspective view of the casting case used for molding the mold resin 60.

First Step: Provision of Package 100

In a first step, the package 100 is provided that includes the dark-colored resin 40 and the plurality of leads 10. In the description below, a method of forming the package 100 using the transfer molding method will be described.

Figure 3A:
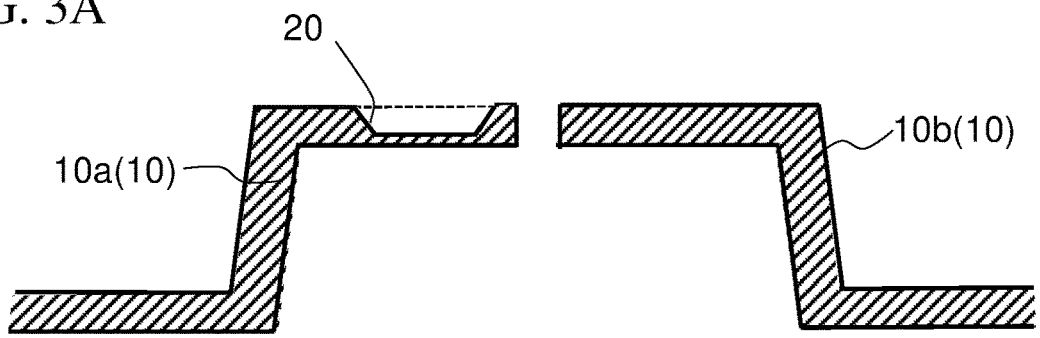
FIG. 3A is a step cross-sectional view illustrating a manufacturing step of the light emitting device illustrated in FIG. 1.
Figure 4:
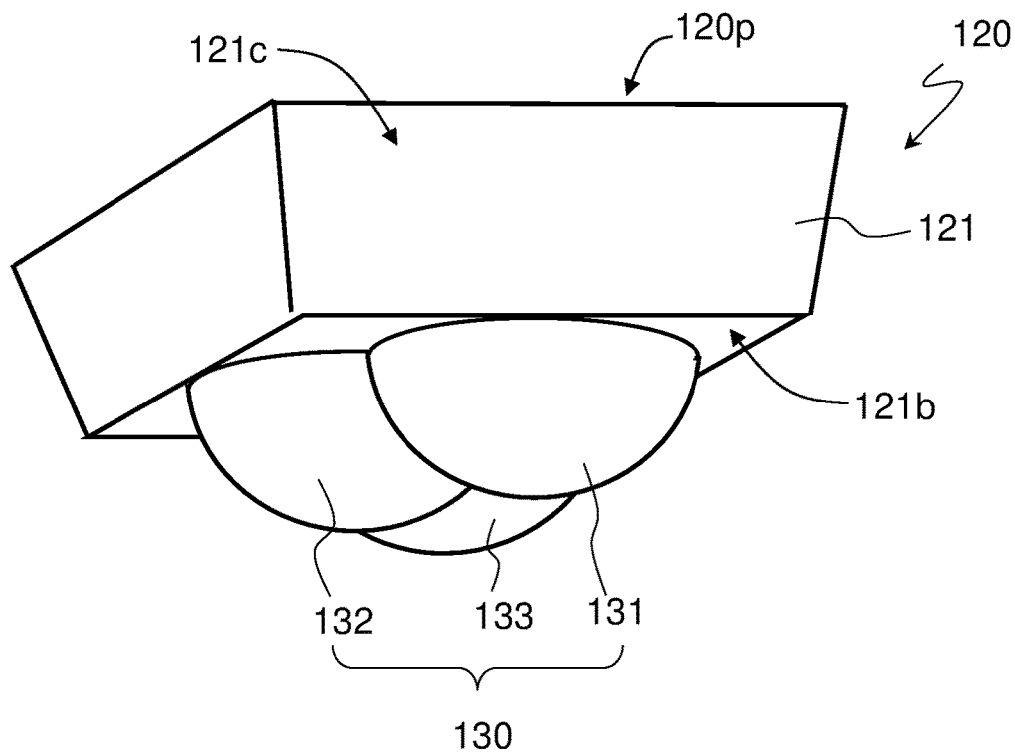
FIG. 4 is a schematic perspective view of an upper cavity and a lower cavity in a casting case used for manufacturing the light emitting device.

As illustrated in FIG. 3A, the lead frame including the plurality of leads 10 is provided. In the example herein, copper is used for the substrate (lead substrate), and the lead 10 is used in which a silver plating layer is formed on the surface of the lead substrate. The plurality of leads 10 includes at least two lead pairs. Each lead pair includes leads 10a and 10b that are separated from each other. In this example, one of the leads, namely, the lead 10a of each lead pair defines the recess 20. In the example herein, the plurality of leads 10 include three lead pairs for a single package.

As described above, the leads 10 may be formed by sequentially forming the plating layers having different surface roughnesses from each other, on the lead substrate. Accordingly, the surface roughness and glossiness of the lead 10 can be partially varied. For example, the first plating layer (for example, a roughened plating layer) having a large surface roughness is disposed on surfaces of the lead substrate defining the recess 20 (including surfaces defining the recess and a surface of the region excluding the recess). The term "roughened plating layer" as used herein refers to, for example, a plating layer having a glossiness of 0.2 or less. Subsequently, in a state in which at least a portion of the region excluding the recess 20 is covered with a mask, the second plating layer (for example, a smooth plating layer) having a surface smoother than that of the first plating layer is formed. The term "smooth plating layer" as used herein refers to, for example, a plating layer having a glossiness of 0.8 or greater. In this manner, the second plating layer is formed on the surface of the first plating layer in each of the recesses 20, so that the surface roughness of surfaces defining the recess 20 is reduced. On the other hand, the second plating layer is not formed in the region other than the recess 20, which is covered by the mask, so that the surface roughness of surfaces defining the recess 20 is the surface roughness of the first plating layer, and is greater than the surface roughness of the surfaces defining the recess 20. After this, the mask is removed to obtain the leads 10. Any appropriate techniques may be employed for disposing and removing the mask. Further, it is sufficient that the mask be disposed covering a region having a surface roughness greater than that of surfaces defining the recess 20, and the mask does not necessarily cover the entire region other than the recess 20. Alternatively, a region on which the second plating layer is planned to be disposed can be covered with the mask when disposed the first plating layer, and a region on which the first plating layer is planned to be disposed can be covered with the mask when forming the second plating layer, which also allows for varying surface roughness. The materials of the first plating layer and the second plating layer may be the same (a silver plating layer, for example) or different. When using different materials, for example, a gold plating layer having a low reflectivity may be disposed to serve as the roughened plating layer, and a silver plating layer having a high reflectivity may be disposed to serve as the smooth plating layer.

Figure 3B:
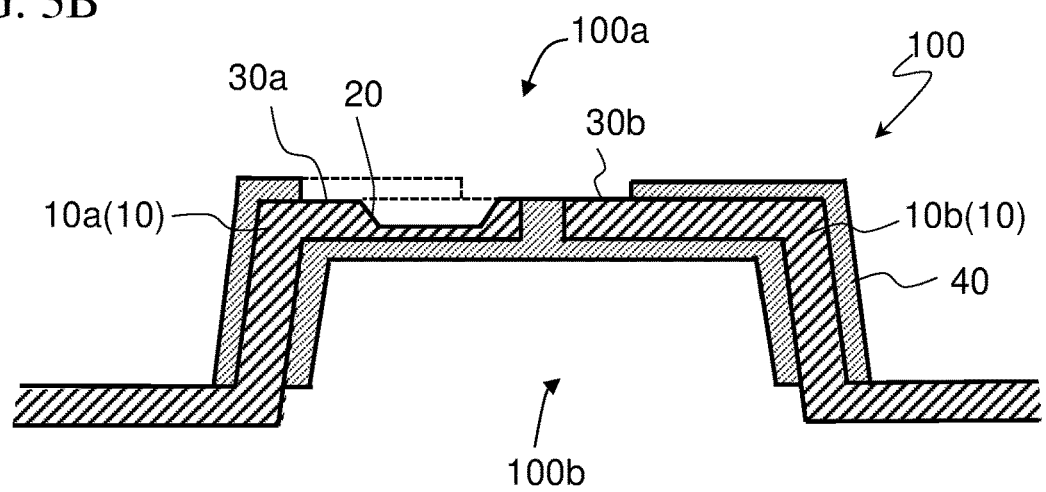
FIG. 3B is a step cross-sectional view illustrating a manufacturing step of the light emitting device illustrated in FIG. 1.

Subsequently, a die is provided, and the lead frame is placed in the die. After this, a thermoplastic resin material colored in a dark color is injected into the die and solidified by being cooled. Accordingly, as illustrated in FIG. 3B, the dark-colored resin 40 that holds the plurality of leads 10 is formed. In this manner, the package 100 is obtained.

The leads 10a and 10b include exposed regions 30a and 30b, respectively, that are exposed at the primary surface 100a of the package 100. The recess 20 is positioned in the exposed region 30a of the lead 10a of each lead pair.

Second Step: Mounting of Light Emitting Element 50

Figure 3C:
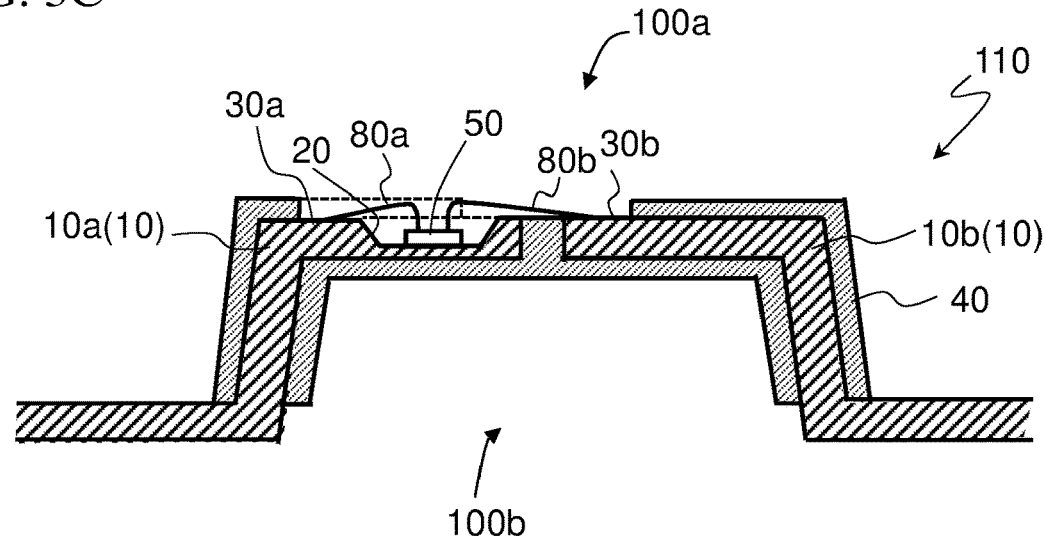
FIG. 3C is a step cross-sectional view illustrating a manufacturing step of the light emitting device illustrated in FIG. 1.

In a second step, as illustrated in FIG. 3C, the light emitting element 50 is mounted on the package 100.

In the primary surface 100a of the package 100, the light emitting element 50 is bonded into the recess 20 of one of the leads, namely, the lead 10a of each lead pair, using, for example, a conductive paste.

Subsequently, the positive and negative electrodes of each of the light emitting elements 50 are electrically connected to the exposed regions 30a and 30b of the two leads 10a and 10b of a corresponding lead pair by the wires 80a and 80b, respectively. In this manner, a first structure 110 is formed that includes the package 100 and the light emitting elements 50 mounted on the primary surface 100a of the package 100.

In the present embodiment, in the package 100, a first structure 110 is formed in which three light emitting elements 50 of different light emission colors from each other are mounted. The light emitting elements 50 include the first light emitting element configured to emit first light, the second light emitting element configured to emit second light, and the third light emitting element configured to emit third light.

Third Step: Formation of Mold Resin 60

At a third step, the mold resin 60 is formed using, for example, a casting technique.

Provision of Casting Case 120

First, a casting case 120 is provided that defines an opening 120p, an upper cavity 121, and a plurality of lower cavities 130 as illustrated in FIG. 4. The opening 120p is located above the upper cavity 121. The upper cavity 121 is defined by a base surface 121b and lateral surfaces 121c formed continuously from the base surface 121b. Each of the lower cavities 130 protrudes downwardly from the base surface 121b of the upper cavity 121. The upper cavity 121 has a shape corresponding to the base portion. In this example, the base surface 121b of the upper cavity 121 has a shape corresponding to the upper surface of the base portion, and the lateral surfaces 121c have a shape corresponding to the lateral surfaces of the base portion. The lower cavity 130 has a shape corresponding to the lens portion. In this embodiment, the plurality of lower cavities 130 includes a first cavity 131, a second cavity 132, and a third cavity 133.

As described above, at least a portion of the inner surface defining the upper cavity 121 of the casting case 120 may be roughened. For example, the inside of the base surface 121b and the lateral surfaces 121c of the upper cavity 121 of the casting case 120 may be roughened. The inner surface defining the lower cavities 130 need not be roughened. Any appropriate technique may be used for roughening the casting case 120. For example, a surface of the casting case 120 can be roughened by performing electric discharge machining or the like on a die for molding the casting case 120.

First Resin Injection Step

Figure 5A:
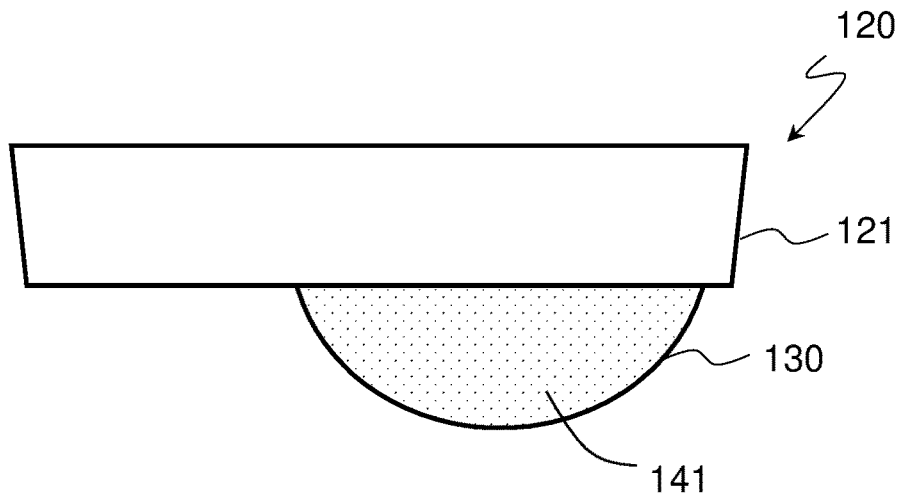
FIG. 5A is a step cross-sectional view illustrating a manufacturing step of the light emitting device illustrated in FIG. 1.

Next, as illustrated in FIG. 5A, a first resin 141 whose base material is a thermosetting resin is injected into each of the plurality of lower cavities 130. In the example herein, an epoxy resin is used as the base material of the first resin 141. The first resin 141 injected into at least two of the plurality of lower cavities 130 are colored in mutually different colors in the at least two lower cavities 130.

In the present embodiment, the first resin colored in a similar color as the first light is injected into the first cavity 131 of the casting case 120 illustrated in FIG. 4, the first resin colored in a similar color as the second light is injected into the second cavity 132, and the first resin colored in a similar color as the third light is injected into the third cavity 133.

Semi-Curing Step

Figure 5B:
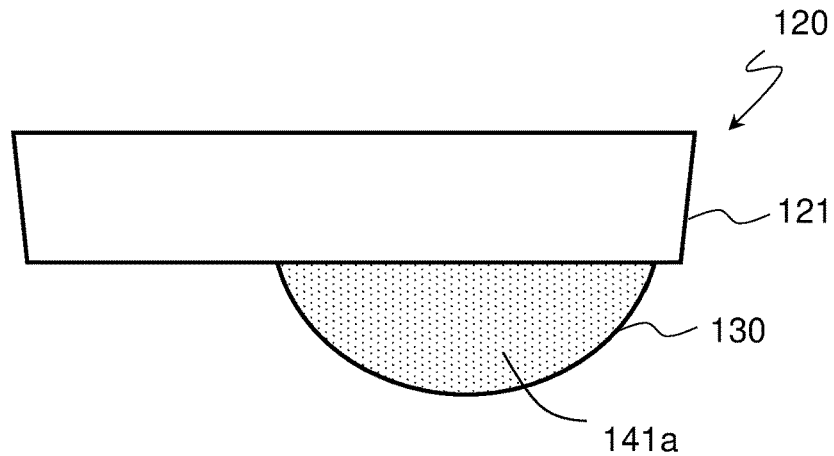
FIG. 5B is a step cross-sectional view illustrating a manufacturing step of the light emitting device illustrated in FIG. 1.

Subsequently, the first resin 141 injected into the casting case 120 is semi-cured (primary curing). In the example herein, the first resin 141 is heated at a temperature lower than the curing temperature of the thermosetting resin that is the base material of the first resin 141. Accordingly, as illustrated in FIG. 5B, a semi-cured body 141a of the first resin 141 is formed in the lower cavity 130.

Second Resin Injection Step

Figure 5C:
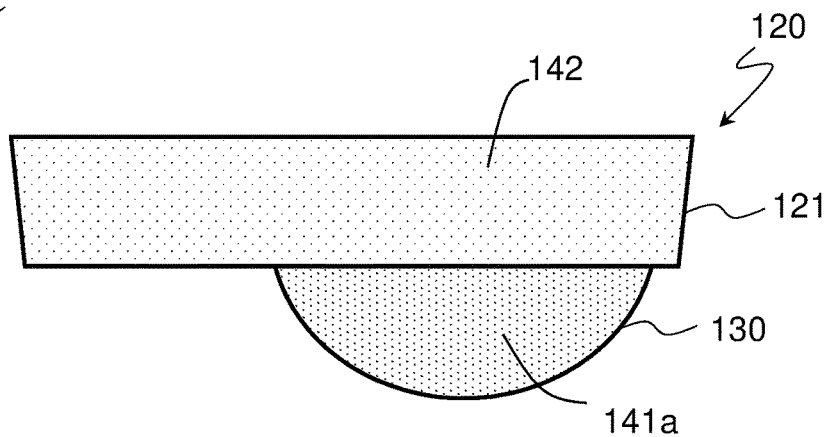
FIG. 5C is a step cross-sectional view illustrating a manufacturing step of the light emitting device illustrated in FIG. 1.

After forming the semi-cured body 141a, a second resin 142 whose base material is a thermosetting resin is injected into the upper cavity 121 of the casting case 120, as illustrated in FIG. 5C. The base material of the second resin 142 may be the same as or different from the base material of the first resin. In the example herein, an epoxy resin is used as the base material of the second resin 142. The second resin 142 is not necessarily colored.

Immersion Step

Figure 5D:
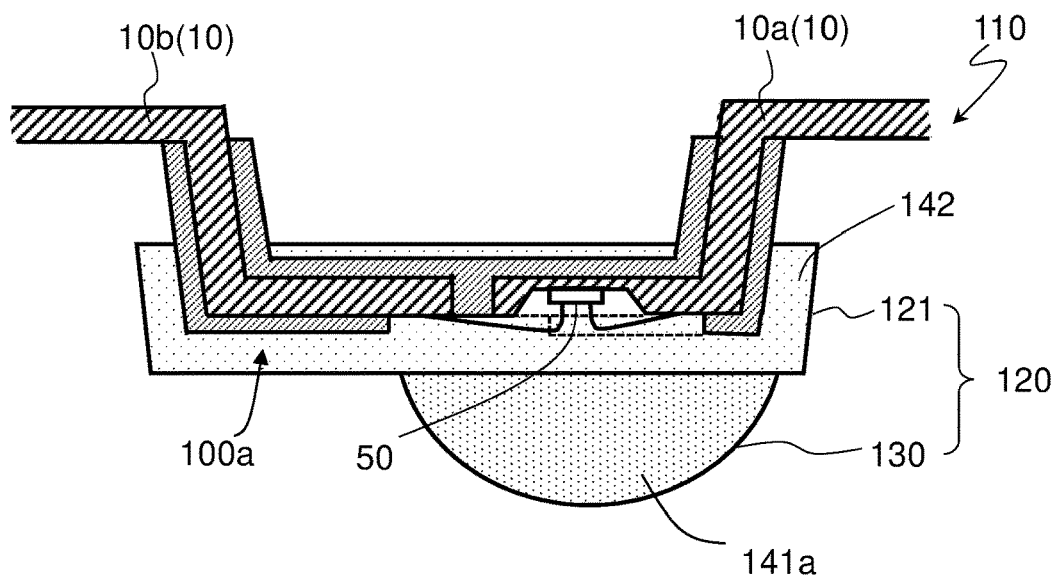
FIG. 5D is a step cross-sectional view illustrating a manufacturing step of the light emitting device illustrated in FIG. 1.

Subsequently, as illustrated in FIG. 5D, with the first structure 110 placed to face downward, a portion of the first structure 110 is immersed in the second resin 142 in the casting case 120. More specifically, the light emitting elements 50 in the first structure 110 and the primary surface 100a of the package 100 are immersed in the second resin 142 such that each of the plurality of light emitting elements 50 overlaps with a corresponding one of the plurality of lower cavities 130 in a plan view.

In the present embodiment, in a plan view, the first structure 110 is immersed in the second resin 142 such that the first light emitting element, the second light emitting element, and the third light emitting element in the first structure 110 overlap with the first cavity 131, the second cavity 132, and the third cavity 133 of the casting case 120 illustrated in FIG. 4, respectively.

Full Curing Step

Figure 5E:
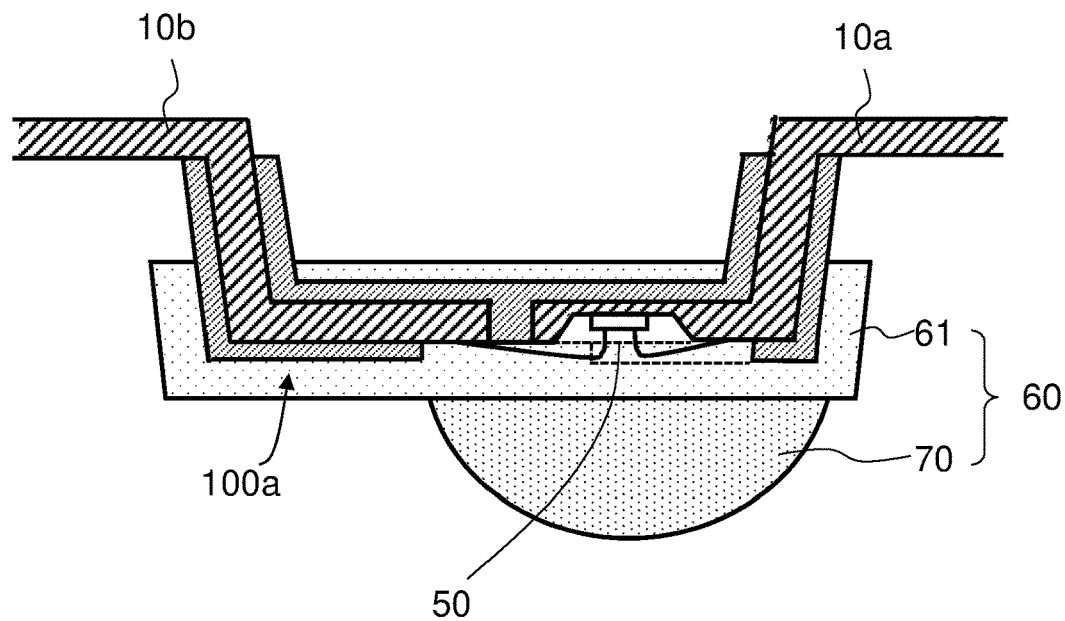
FIG. 5E is a step cross-sectional view illustrating a manufacturing step of the light emitting device illustrated in FIG. 1.

With the first structure 110 immersed in the second resin 142, the semi-cured body 141a of the first resin and the second resin 142 are cured. A full curing step is performed at a temperature equal to or greater than the curing temperature of the base material of the first resin and the second resin 142. Thereafter, the casting case 120 is removed. Thus, as illustrated in FIG. 5E, the mold resin 60 is obtained that includes the base portion 61 that covers the primary surface 100a of the package 100, and at least two lens portions 70 colored to mutually different colors. The lens portions 70 of the mold resin 60 are formed from the semi-cured body 141a of the first resin, and the base portion 61 is formed from the second resin 142.

When using the casting case 120 having a roughened inner surface that define the upper cavity, the mold resin 60 is obtained having a surface that is partially roughened reflecting the roughened surface shape of the upper cavity. On the other hand, when using the casting case 120 without a roughened surface, after taking out the mold resin from the casting case 120, roughening may be performed on at least a portion of a surface of the base portion 61 of the mold resin 60. For example, in a state in which the lens portions 70 are masked, roughening such as blasting may be performed on a portion, of the upper surface 61a of the base portion 61, that does not overlap with the plurality of lens portions 70 in a plan view, and on the lateral surfaces 61b of the base portion 61.

Figure 5F:
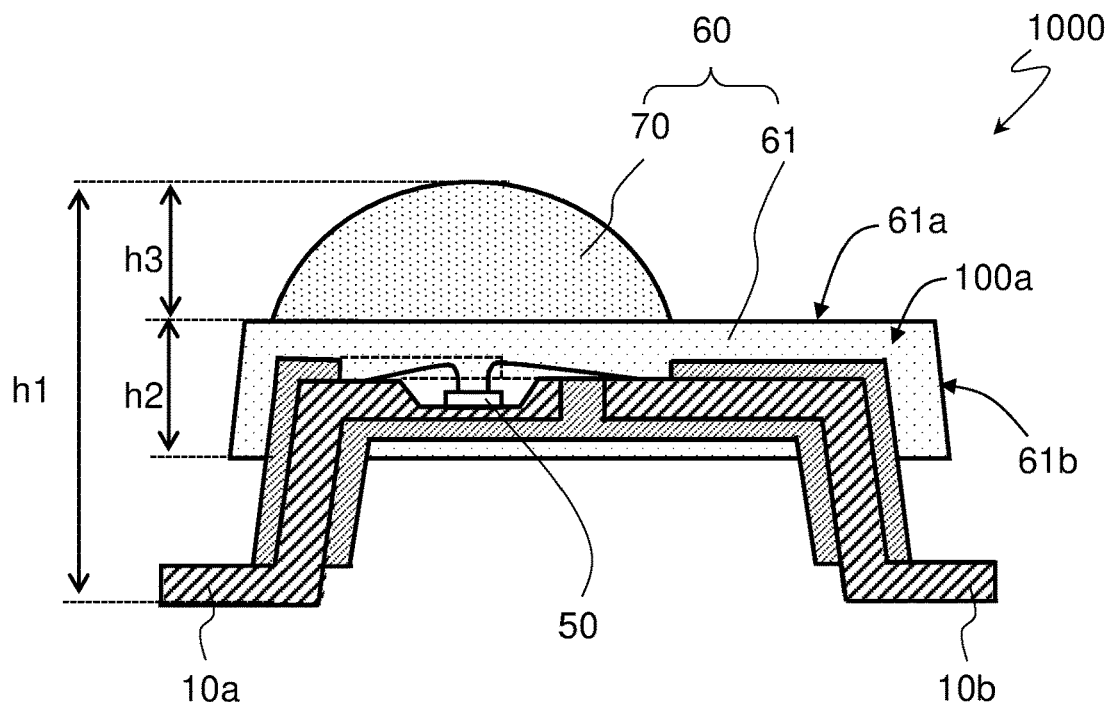
FIG. 5F is a step cross-sectional view illustrating a manufacturing step of the light emitting device illustrated in FIG. 1.

Subsequently, as illustrated in FIG. 5F, the leads 10 is cut from the lead frame to be singulated, so that the light emitting device 1000 is obtained. In this example, the outer shape of the light emitting device 1000 in a top view has a generally square shape of 6 mm×6 mm, for example. A height h1 in the z-axis direction of the light emitting device 1000 is 4.2 mm, for example, and thicknesses h2 and h3 in the z-axis direction of the base portion 61 and the lens portion 70 are respectively 1.5 mm, for example.

According to the method of manufacturing the present embodiment, by performing the curing for forming the mold resin 60 in two steps, the plurality of lens portions 70 that are colored in the different colors and the base portion 61 can be integrally formed using the same casting case 120. Thus, it is possible to reduce an increase in manufacturing costs and in the number of manufacturing steps. Further, it is possible to hold the plurality of lens portions 70 in the predetermined positions in a stable manner.

While the method of manufacturing the light emitting device 1000 has been described above as an example, the method of manufacturing according to the present disclosure is applied to a light emitting device that includes at least two light emitting elements having mutually different light emission colors.

Various modified examples can be made with respect to the light emitting device. For example, the structure and arrangement of the light emitting elements, the structure and form of the package, the configuration of the mold resin, and the like are not limited to those modes described in the embodiment described above. Modes other than those described in the above-described embodiment can be preferably used in the light emitting device of the present disclosure.

Modified examples of the light emitting device of the present disclosure will be described below. In the description below, structures different from those of the light emitting device 1000 will be mainly described, and a description of structures similar to those of the light emitting device 1000 will be omitted. Further, in each of the drawings illustrating the modified examples, components similar to those of the light emitting device 1000 are denoted by the same reference numerals.

First Modified Example

Figure 6A:
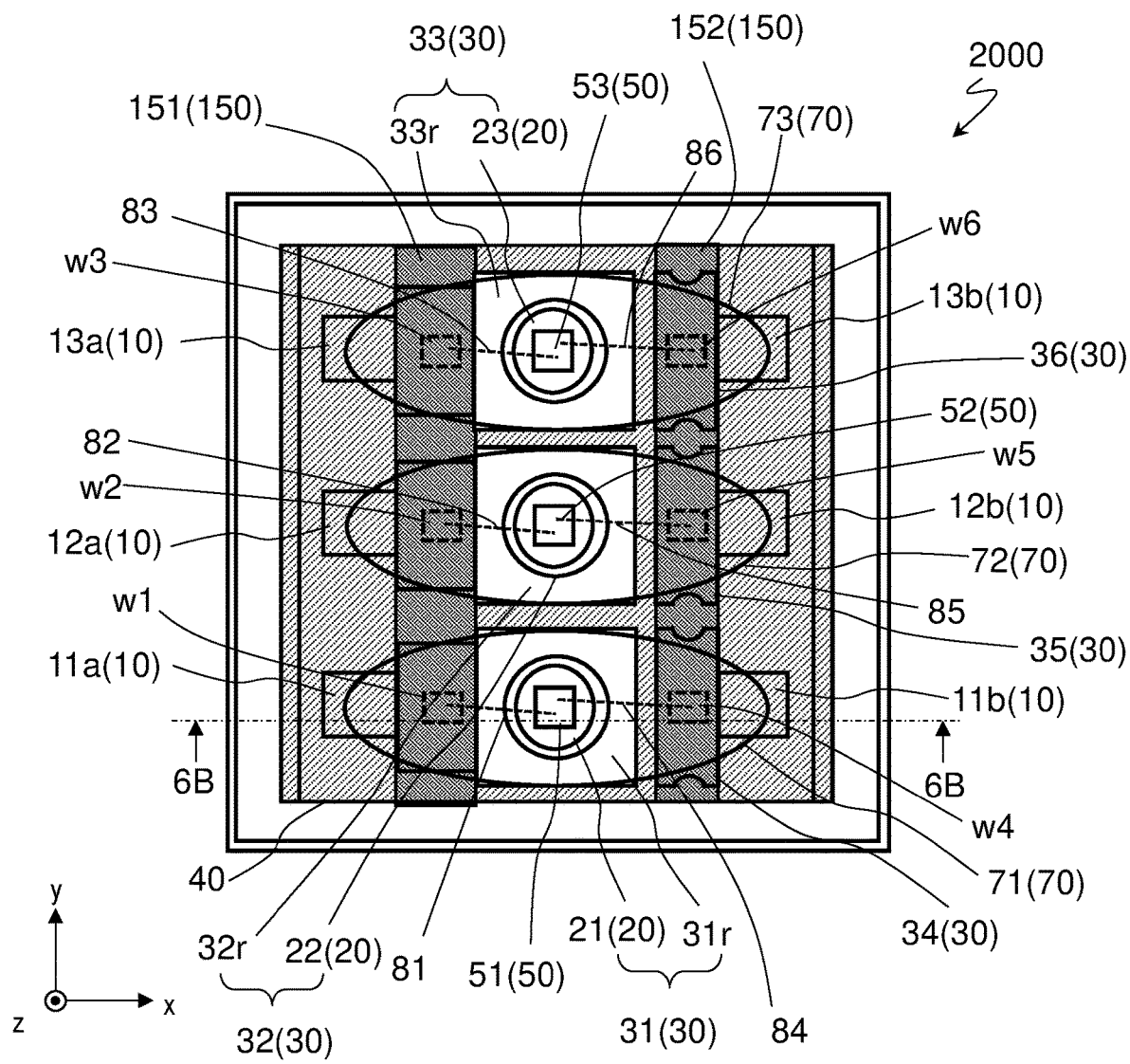
FIG. 6A is a schematic top plan view of another light emitting device according to the present disclosure.
Figure 6B:
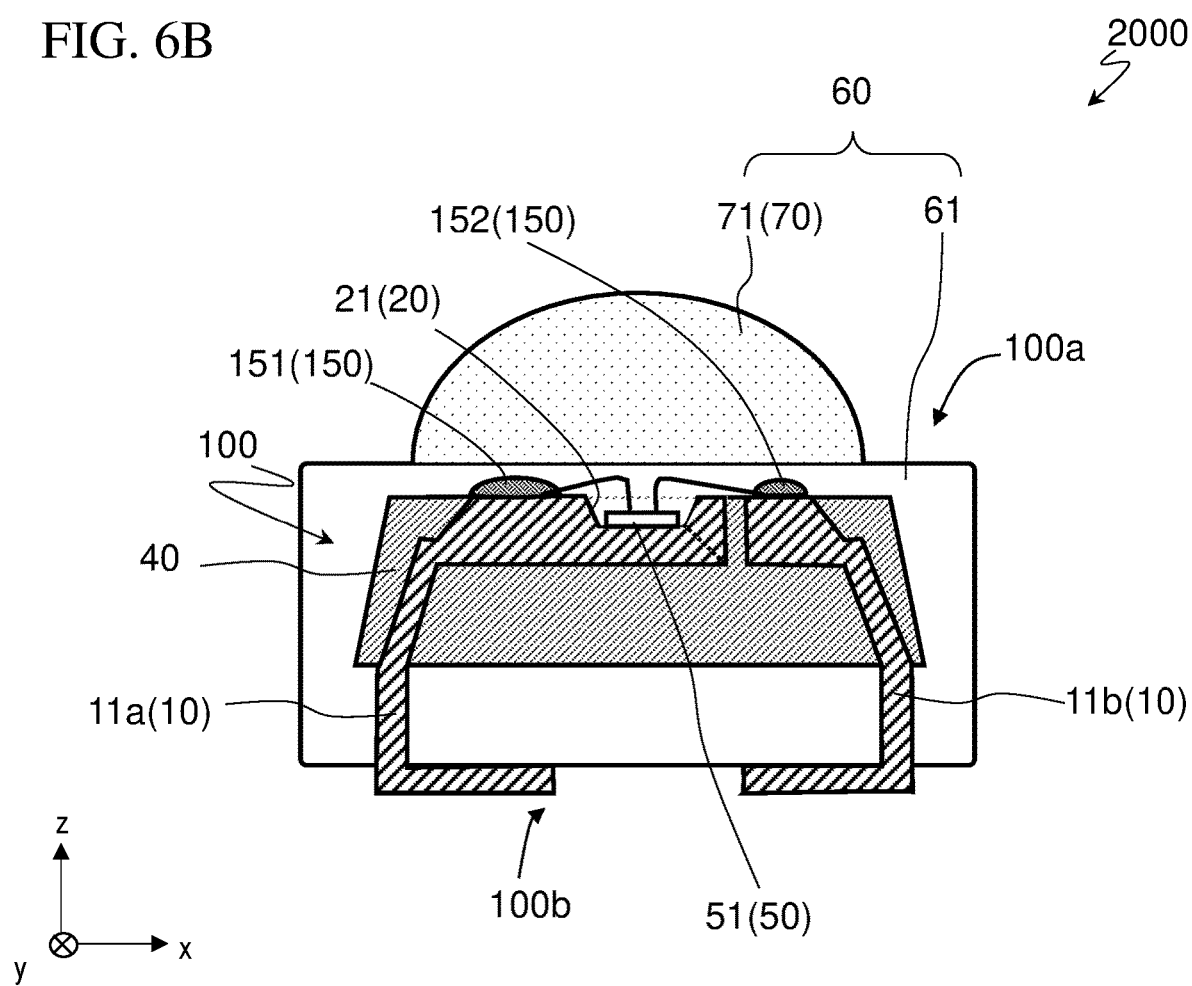
FIG. 6B is a schematic cross-sectional view taken along line 6B-6B illustrated in FIG. 6A.

FIG. 6A is a schematic top plan view of another light emitting element 2000 of the present embodiment. FIG. 6B is a schematic cross-sectional view taken along line 6B-6B in FIG. 6A.

In the light emitting device 2000, the first recess 21, the second recess 22, and the third recess 23 are arranged in the first direction (the y-axis direction in this case) in the primary surface 100a of the package 100. Accordingly, the first light emitting element 51, the second light emitting element 52, and the third light emitting element 53 are also arranged substantially in a single row in the y-axis direction. Also, the centers of the first lens portion 71, the second lens portion 72, and the third lens portion 73 are arranged substantially in a single row in the y-axis direction.

The plurality of leads 10 are bent inwardly at the back surface 100b of the package 100. The bent portion of each of the leads 10 is exposed at the back surface 100b, and serves as the mounting surface.

The light emitting device 2000 may further include a second dark-colored resin 150 between the primary surface 100a of the package 100 and the mold resin 60. The second dark-colored resin 150 is disposed to cover a portion (the wire connection portion), of each of the leads 10, to which the wire is connected. With this structure, decrease in contrast caused by the connection portion between each of the leads 10 and the wire can be reduced.

In the example illustrated in FIG. 6A, the peripheral portion 31r of the first lead 11a includes a wire connection portion w1 to which the wire 81 is connected. Similarly, the peripheral portion 32r of the second lead 12a and the peripheral portion 33r of the third lead 13a include wire connection portions w2 and w3, respectively, to which the wires 82 and 83 are respectively connected. Further, the fourth lead 11b, the fifth lead 12b, and the sixth lead 13b also include wire connection portions w4, w5, and w6 to which the wires 84, 85, and 86 are connected, respectively.

The second dark-colored resin 150 may extend in the first direction (the y-axis direction in this case) to cover the wire connection portions of two or more (three in this case) of the leads 10. For example, as illustrated in the drawings, the second dark-colored resin 150 may include two portions 151 and 152, which are separated from each other and extend in the y-axis direction. The portion 151 of the second dark-colored resin 150 extends to cover the wire connection portions w1, w2, and w3 in the first lead 11a, the second lead 12a, and the third lead 13a. The portion 152 extends to cover the wire connection portions w4, w5, and w6 in the fourth lead 11b, the fifth lead 12b, and the sixth lead 13b. The second dark-colored resin 150 may have a shape other than that illustrated in the drawings. For example, the second dark-colored resin 150 may be separated into three or more portions.

For the second dark-colored resin 150, a resin material and a colorant similar to those of the dark-colored resin 40 may be used. For the second dark-colored resin 150, a silicone resin material to which carbon black has been added can be used, for example.

The light emitting device 2000 may be manufactured using a method similar to the method of manufacturing the light emitting device 1000 described above with reference to FIGS. 3A to 5F. However, in the present modified example, after joining the light emitting elements 50 to the package 100, the second dark-colored resin 150 is formed to cover a portion of each of the leads 10 connected to the wire. Subsequently, similarly to the light emitting device 1000, the mold resin 60 is formed using a casting technique, and the leads 10 are cut. After being cut from the lead frame, the leads 10 are bent.

Also in the light emitting device 1000 described above, the second dark-colored resin may be disposed on the primary surface 100a of the package 100 to cover the wire connection portion of each of the leads 10.

Second Modified Example

Figure 7:
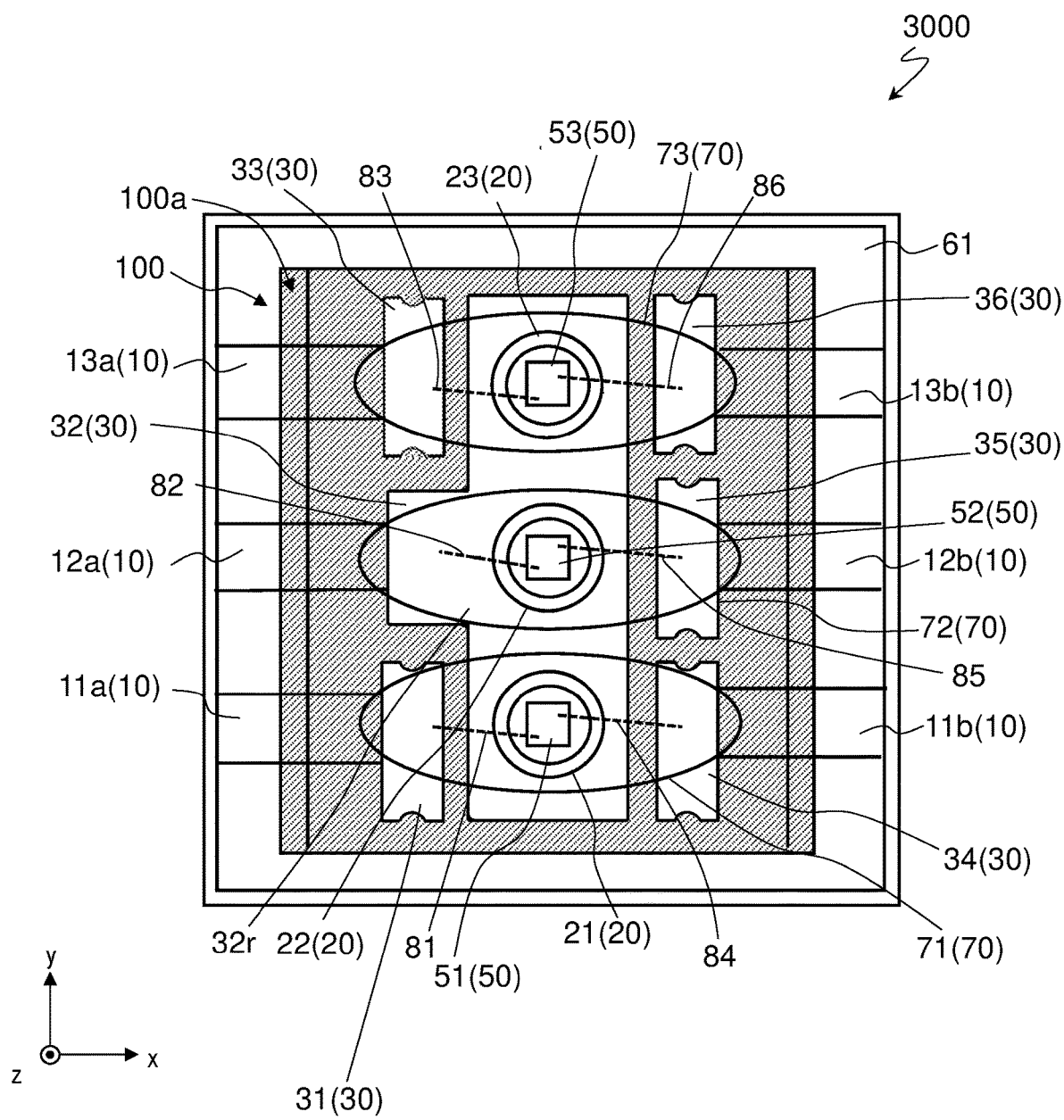
FIG. 7 is a schematic top plan view of another light emitting device 3000 according to the present disclosure.

FIG. 7 is a schematic top plan view of another light emitting element 3000 of the present embodiment.

The light emitting device 3000 differs from the light emitting device 2000 illustrated in FIG. 6A and FIG. 6B in that the first recess 21, the second recess 22, and the third recess 23 are defined in one of the leads 10.

In the light emitting device 3000, the first recess 21, the second recess 22, and the third recess 23 are defined in the second region 32 of the second lead 12a. As illustrated in FIG. 7, in a plan view, the second region 32 may extend in the y-axis direction, and the first recess 21, the second recess 22, and the third recess 23 may be arranged in the y-axis direction. As described above, the first recess 21, the second recess 22, and the third recess 23 need not necessarily be arranged in a single row.

In the example illustrated in FIG. 7, in the primary surface 100a of the package 100, the first region 31 of the first lead 11a and the fourth region 34 of the fourth lead 11b are located on the left side (the negative x side) and the right side (the positive x side), respectively, with respect to the first recess 21 in the second region 32.

The fifth region 35 of the fifth lead 12b is located on the right side (the positive x side) of the second recess 22 in the second region 32. The third region 33 of the third lead 13a and the sixth region 36 of the sixth lead 13b are located on the left side (the negative x side) and the right side (the positive x side), respectively, with respect to the third recess 23 in the second region 32. With the exposed region 30 of each of the leads 10 located in close proximity to a corresponding light emitting element 50 in this manner, the lead 10 and the corresponding light emitting element 50 can be more easily connected together.

The second dark-colored resin may be disposed on a primary surface 100a of the package 100 in the light emitting device 3000 to cover the wire connection portions. Similarly to the example illustrated in FIG. 6A, the second dark-colored resin may include a portion extending in the y-axis direction to cover the wire connection portions of the first lead 11a, the second lead 12a, and the third lead 13a, and a portion extending in the y-axis direction to cover the wire connection portion of the fourth lead 11b, the wire connection portion of the fifth lead 12b, and the wire connection portion of the sixth lead 13b.

While three recesses 20 are defined in one of the leads 10 (the second lead 12a in this example) in the example illustrated in FIG. 7, two recesses among the first recess 21, the second recess 22, and the third recess 23 may be defined in one of the leads 10, and the remaining one of the first to third recesses 21 to 23 may be defined in the other lead 10

According to the present modified example, defining two or more of the recesses 20 in the exposed region 30 of a single lead 10 allows for reducing the distance between the recesses 20. Accordingly, the size of the package 100 can be further reduced.

Third Modified Example

Figure 8:
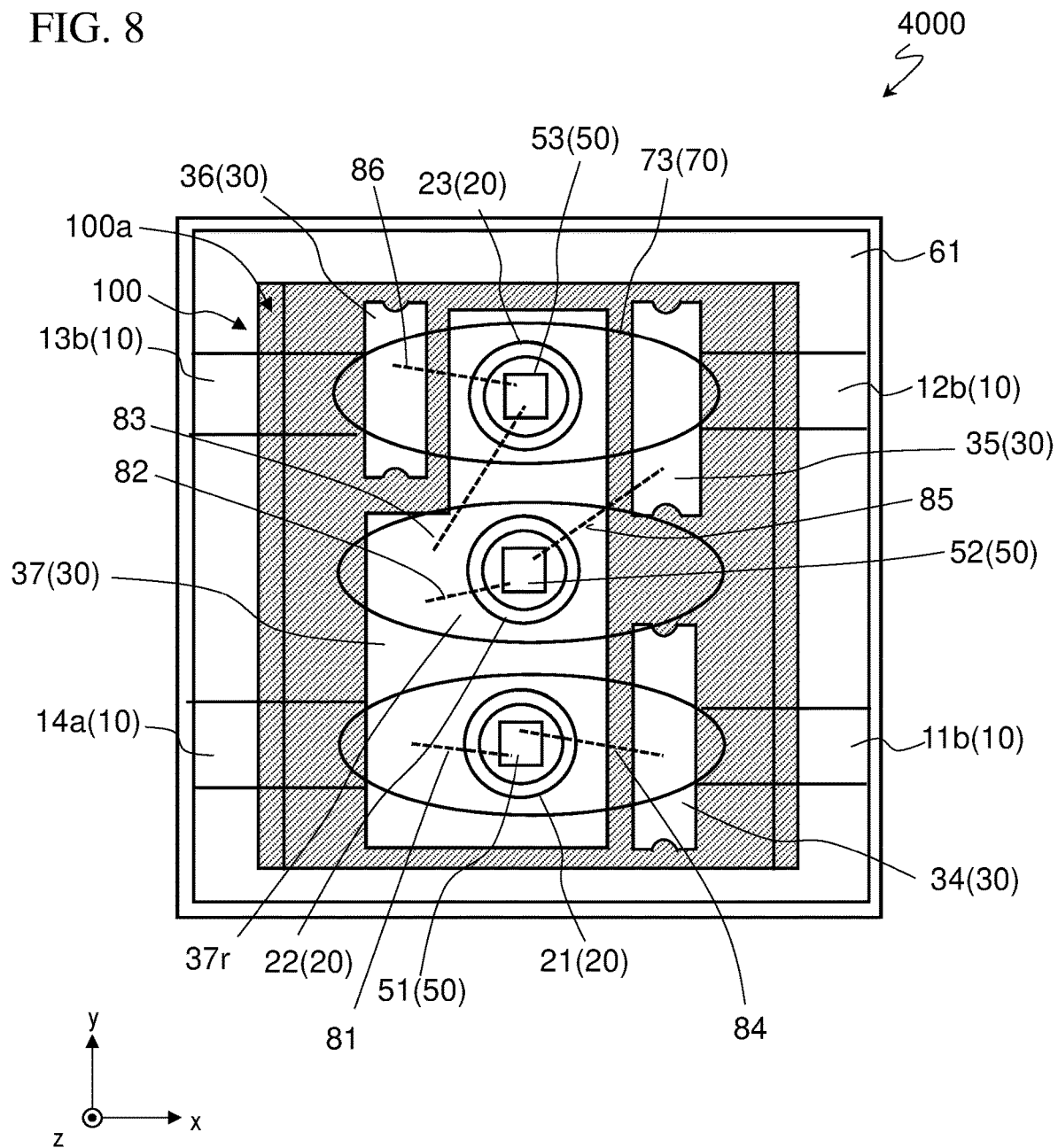
FIG. 8 is a schematic top plan view of another light emitting device 4000 according to the present disclosure.

FIG. 8 is a schematic top plan view of another light emitting device 4000 according to the present embodiment.

The light emitting element 4000 differs from the light emitting device 2000 illustrated in FIG. 6A and FIG. 6B in that the light emitting element 4000 includes a common lead 14a electrically connected to the first light emitting element 51, the second light emitting element 52, and the third light emitting element 53, and in that the first recess 21, the second recess 22, and the third recess 23 are defined in the common lead 14a.

In the light emitting element 4000, the plurality of leads 10 include the common lead 14a, the fourth lead 11b, the fifth lead 12b, and the sixth lead 13b. An end portion of the common lead 14a, an end portion of the fourth lead 11b, an end portion of the fifth lead 12b, and an end portion of the sixth lead 13b are exposed at the back surface of the package 100. The portions exposed at the back surface of the package 100 serve as the mounting surfaces (four terminals) when fixing the light emitting element 4000 to the mounting substrate.

The common lead 14a includes a seventh region 37 exposed at the primary surface 100a of the package 100. The seventh region 37 includes the first recess 21, the second recess 22, and the third recess 23, and a peripheral portion 37r. The peripheral portion 37r is a region of the seventh region 37 excluding the first recess 21, the second recess 22, and the third recess 23, and is used for wire bonding.

As illustrated in FIG. 8, in a plan view, the seventh region 37 may extend in the y-axis direction, and the first recess 21, the second recess 22, and the third recess 23 may be arranged in the y-axis direction. As described above, the first recess 21, the second recess 22, and the third recess 23 is not necessarily arranged in a single row.

In the example illustrated in FIG. 8, in the primary surface 100a of the package 100, the fourth lead 11b is positioned on the right side (the positive x side) of the common lead 14a. The fifth lead 12b and the sixth lead 13b are positioned on the right side (the positive x side) and the left side (the negative x side), respectively, with respect to the seventh region 37 of the common lead 14a.

The positive and negative electrodes of the first light emitting element 51 are electrically connected to the peripheral portion 37r of the seventh region 37 of the common lead 14a and to the fourth region 34 of the fourth lead 11b, respectively, by the wires 81 and 84. The positive and negative electrodes of the second light emitting element 52 are electrically connected to the peripheral portion 37r of the seventh region 37 of the common lead 14a and to the fifth region 35 of the fifth lead 12b by the wires 82 and 85, respectively. The positive and negative electrodes of the third light emitting element 53 are electrically connected to the peripheral portion 37r of the seventh region 37 of the common lead 14a and to the sixth region 36 of the sixth lead 13b by the wires 83 and 86, respectively.

The second dark-colored resin may be disposed on the primary surface 100a of the package 100 in the light emitting device 4000. The second dark-colored resin may have a shape similar to the shape illustrated in the example in FIG. 6A. For example, the second dark-colored resin may include a portion extending in the y-axis direction to cover the wire connection portions of the common lead 14a and the sixth lead 13b, and a portion extending in the y-axis direction to cover the wire connection portions of the fourth lead 11b and the fifth lead 12b.

While three recesses 20 are defined in the common lead 14a in the example illustrated in FIG. 8, two recesses 20 may be defined in the common lead 14a, and the remaining one of the recesses 20 may be defined in another of the leads.

Also, while the common lead 14a is used that is electrically connected to the first light emitting element 51, the second light emitting element 52, and the third light emitting element 53 in the example illustrated in FIG. 8, alternatively, a common lead may be used that is electrically connected to only two of the light emitting elements (the first light emitting element 51 and the second light emitting element 52, for example).

According to the present modified example, the number of leads 10 can be reduced by using the common lead connected to two or more of the light emitting elements 50. Further, defining the two or more of the recesses 20 in one of the leads (the common lead 14a in this case) allows for reducing the distance between the recesses 20. Accordingly, a size of the package 100 can be further reduced.

The light emitting device according to the present disclosure can be preferably used as a light emitting device in various applications. In particular, the light emitting device according to the present disclosure is preferably used in the display device such as the LED display. The LED display is used for billboards, large televisions, advertisements, traffic information, stereoscopic display devices, illumination devices, and the like.

In the description above, certain embodiments of the present invention are described. However, the present invention is not limited the description above, and should be broadly construed on the basis of the claims. The present invention also encompasses variations and modifications that are made on the basis of the description above.

What is claimed is:

1. A light emitting device, comprising:
   a package for surface mounting, the package comprising a plurality of leads and a dark-colored resin securing at least some of the plurality of leads, three leads of the plurality of leads respectively including an exposed region exposed from the dark-colored resin at a primary surface of the package, with a first recess, a second recess, and a third recess each being defined in the exposed region of a respective one of the three leads;
   a plurality of light emitting elements, said plurality of light emitting elements including a first light emitting element disposed in the first recess and configured to emit first light, a second light emitting element disposed in the second recess and configured to emit second light having a wavelength shorter than a wavelength of the first light, and a third light emitting element disposed in the third recess and configured to emit third light having a wavelength shorter than a wavelength of the second light; and
   a mold resin sealing the plurality of light emitting elements, wherein
   the mold resin includes a base portion covering the primary surface of the package and the plurality of light emitting elements, and a plurality of lens portions formed integrally with the base portion,
   each of the plurality of lens portions has a convex shape protruding upwardly from the base portion,
   wherein in a plan view, the plurality of lens portions include a first lens portion overlapping with the first recess and the first light emitting element, a second lens portion overlapping with the second recess and the second light emitting element, and
   a third lens portion overlapping with the third recess and the third light emitting element,
   wherein
   the first lens portion is colored in a similar color as the first light, the second lens portion is colored in a similar color as the second light, and the third lens portion is colored in a similar color as the third light.

2. The light emitting device according to claim 1, wherein the base portion of the mold resin has a light transmittance of 90% or greater at respective peak wavelengths of the plurality of light emitting elements.

3. The light emitting device according to claim 1, wherein each of the first recess, the second recess, and the third recess has a circular shape or an elliptical shape, and centers of the first recess, the second recess, and the third recess are aligned with optical axes of the first lens portion, the second lens portion, and the third lens portion, respectively.

4. The light emitting device according to claim 1, wherein a portion of the base portion of the mold resin covers a surface opposite to the primary surface of the package.

5. The light emitting device according to claim 1, wherein in a plan view, a center of a central one of the first lens portion, the second lens portion, and the third lens portion is not positioned on a line connecting centers of the other two lens portions.

6. The light emitting device according to claim 1, wherein the mold resin further contains a filler or a light diffusing material.

7. The light emitting device according to claim 1, wherein when the first light emitting element, the second light emitting element, and the third light emitting element are turned on, mixed light of light transmitted through the first lens portion, light transmitted through the second lens portion, and light transmitted through the third lens portion is white light or light of a light bulb color, and when the first light emitting element, the second light emitting element, and the third light emitting element are turned off, each of the first lens portion, the second lens portion, and the third lens portion appears in a color of a lower brightness than a brightness of a color with which each of the lens portions is colored.

8. The light emitting device according to claim 1, wherein the base portion includes an upper surface positioned above the primary surface of the package, and a portion of the upper surface of the base portion not overlapping with the plurality of lens portions in a plan view is roughened.

9. The light emitting device according to claim 8, wherein a surface roughness of the portion of the upper surface of the base portion not overlapping with the plurality of lens portions in a plan view is greater than a surface roughness of the plurality of lens portions.

10. The light emitting device according to claim 1, wherein
each of the plurality of leads is electrically connected to a corresponding one of the plurality of light emitting elements via a corresponding wire.

11. The light emitting device according to claim 10, wherein
each of the plurality of leads includes a wire connection portion to which the wire is connected, the wire connection portion located in a region of the exposed region excluding the first recess, the second recess, and the third recess.

12. The light emitting device according to claim 11, wherein
the wire connection portion overlaps with a corresponding one of the plurality of lens portions in a plan view.

13. The light emitting device according to claim 12, wherein
in a cross-sectional view, the wire connection portion is located between opposite portions of the dark-colored resin and separated from the dark-colored resin.

14. The light emitting device according to claim 1, wherein
a glossiness of surfaces defining the first recess, surfaces defining the second recess, and surfaces defining the third recess is different from a glossiness of regions of the exposed regions other than the first recess, the second recess, and the third recess.

15. The light emitting device according to claim 1, wherein
at least a portion of the dark-colored resin protrudes from a lower surface of the base portion.

\* \* \* \* \*